(12) United States Patent
Hamamura et al.

(10) Patent No.: US 6,841,405 B2
(45) Date of Patent: Jan. 11, 2005

(54) PHOTOMASK FOR TEST WAFERS

(75) Inventors: Yuichi Hamamura, Tokyo (JP); Takaaki Kumazawa, Tokyo (JP); Hisao Asakura, Tokyo (JP); Aritoshi Sugimoto, Tokyo (JP); Kazuyuki Tsunokuni, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 60 days.

(21) Appl. No.: 10/269,268

(22) Filed: Oct. 10, 2002

(65) Prior Publication Data

US 2003/0197522 A1 Oct. 23, 2003

Related U.S. Application Data

(62) Division of application No. 10/126,263, filed on Apr. 19, 2002.

(51) Int. Cl.[7] .............................................. H01L 21/00
(52) U.S. Cl. ...................................................... 438/20
(58) Field of Search .............................. 438/20, 23, 26, 438/111, 123, 125, 153, 158; 324/754, 765; 257/357, 620, 681, 758

(56) References Cited

U.S. PATENT DOCUMENTS

| | | | |
|---|---|---|---|
| 6,366,112 B1 | * | 4/2002 | Doherty et al. .............. 324/765 |
| 6,524,874 B1 | * | 2/2003 | Alwan .......................... 438/20 |
| 6,701,202 B2 | * | 3/2004 | Nakano et al. .............. 700/108 |

* cited by examiner

*Primary Examiner*—Kamand Cuneo
*Assistant Examiner*—Monica D. Harrison
(74) *Attorney, Agent, or Firm*—Townsend and Townsend and Crew LLP

(57) ABSTRACT

A manufacturing method of an electronic device is to improve test efficiency using test structure and improve yield. The manufacturing method performs test using a first lead wire disposed on an insulating layer formed on a substrate and a second lead wire electrically connected to the substrate and disposed on the insulating layer and manages the electronic device on the basis of results of the test to manufacture the electronic device. The manufacturing method includes a step of testing whether the first lead wire is disconnected or not by measuring an electric resistance between both ends of the first lead wire and a step of testing whether the first and second lead wires are short-circuited or not by measuring an electric resistance between the first lead wire and the substrate.

16 Claims, 23 Drawing Sheets

FIG.3A

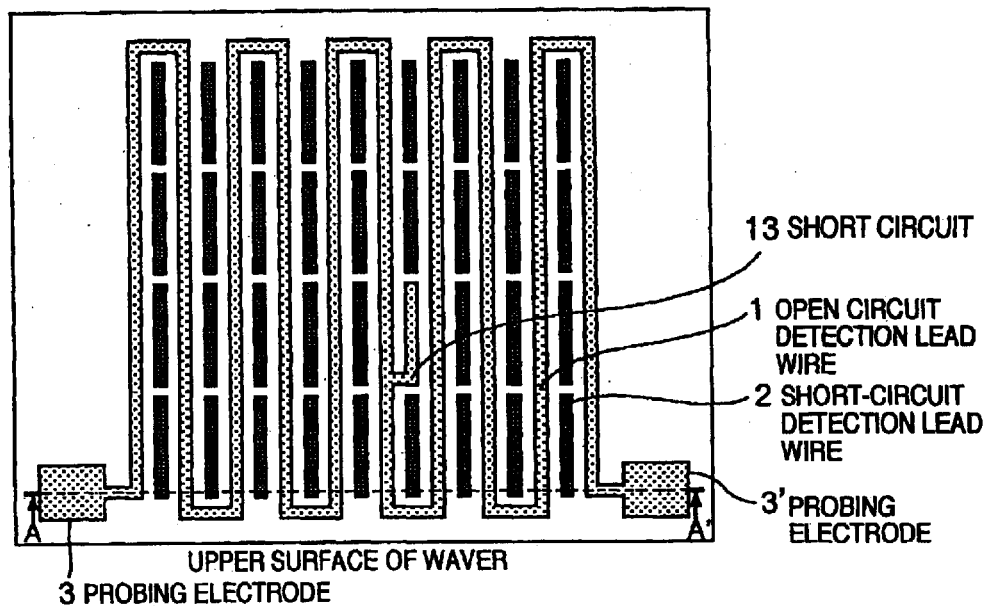

- 13 SHORT CIRCUIT
- 1 OPEN CIRCUIT DETECTION LEAD WIRE
- 2 SHORT-CIRCUIT DETECTION LEAD WIRE
- 3' PROBING ELECTRODE
- UPPER SURFACE OF WAVER
- 3 PROBING ELECTRODE

FIG.3B

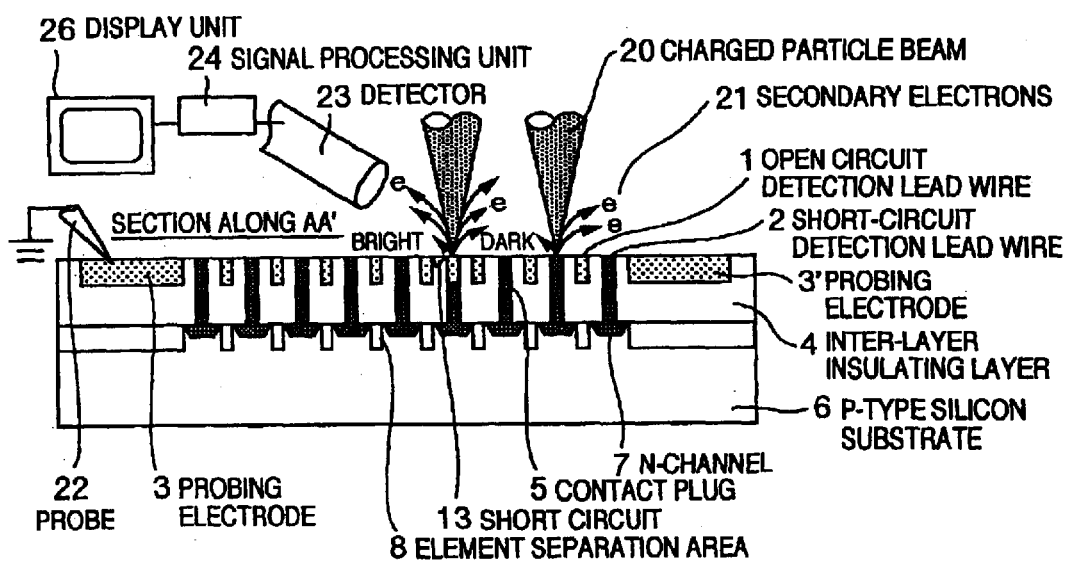

- 26 DISPLAY UNIT
- 24 SIGNAL PROCESSING UNIT
- 23 DETECTOR
- 20 CHARGED PARTICLE BEAM
- 21 SECONDARY ELECTRONS
- 1 OPEN CIRCUIT DETECTION LEAD WIRE
- 2 SHORT-CIRCUIT DETECTION LEAD WIRE
- 3' PROBING ELECTRODE
- 4 INTER-LAYER INSULATING LAYER
- 6 P-TYPE SILICON SUBSTRATE
- 7 N-CHANNEL
- 5 CONTACT PLUG
- 8 ELEMENT SEPARATION AREA
- 13 SHORT CIRCUIT
- 3 PROBING ELECTRODE
- 22 PROBE
- SECTION ALONG AA'
- BRIGHT  DARK (A) LINE SCANNING SIGNAL PROCESSING SYSTEM

IMAGE COMPARISON SYSTEM (A) LINE SCANNING SIGNAL PROCESSING SYSTEM

IMAGE COMPARISON SYSTEM

ORIGINAL PICTURE — COMPARISON PICTURE = DIFFERENCE PICTURE (UNUSUAL)

ORIGINAL PICTURE — COMPARISON PICTURE = DIFFERENCE PICTURE (NOT UNUSUAL)

- 12 OPEN CIRCUIT
- 13 SHORT CIRCUIT
- 1 OPEN CIRCUIT DETECTION LEAD WIRE
- UPPER SURFACE OF WAFER
- 3 PROBING ELECTRODE
- 3' PROBING ELECTRODE
- 2 SHORT-CIRCUIT DETECTION LEAD WIRE

- PROBE 10
- 12 OPEN CIRCUIT
- 13 SHORT CIRCUIT
- 1 OPEN CIRCUIT DETECTION LEAD WIRE
- UPPER SURFACE OF WAFER
- 3 PROBING ELECTRODE
- 3' PROBING ELECTRODE
- 2 SHORT-CIRCUIT DETECTION LEAD WIRE

FIG.15A

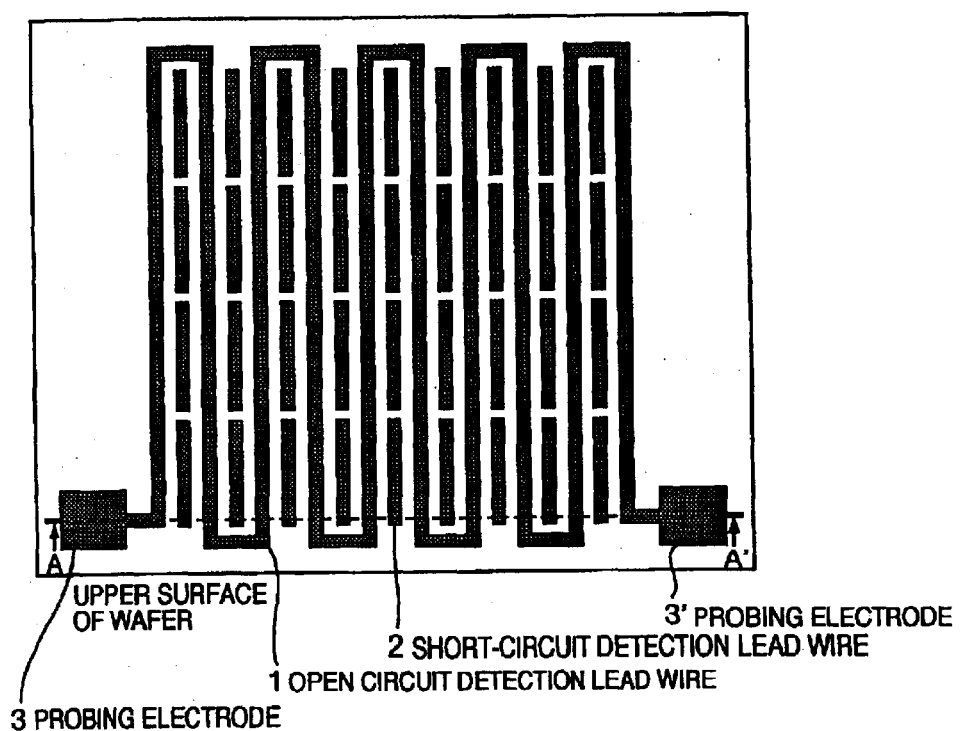

- 3 PROBING ELECTRODE
- UPPER SURFACE OF WAFER
- 3' PROBING ELECTRODE
- 2 SHORT-CIRCUIT DETECTION LEAD WIRE
- 1 OPEN CIRCUIT DETECTION LEAD WIRE

FIG.15B

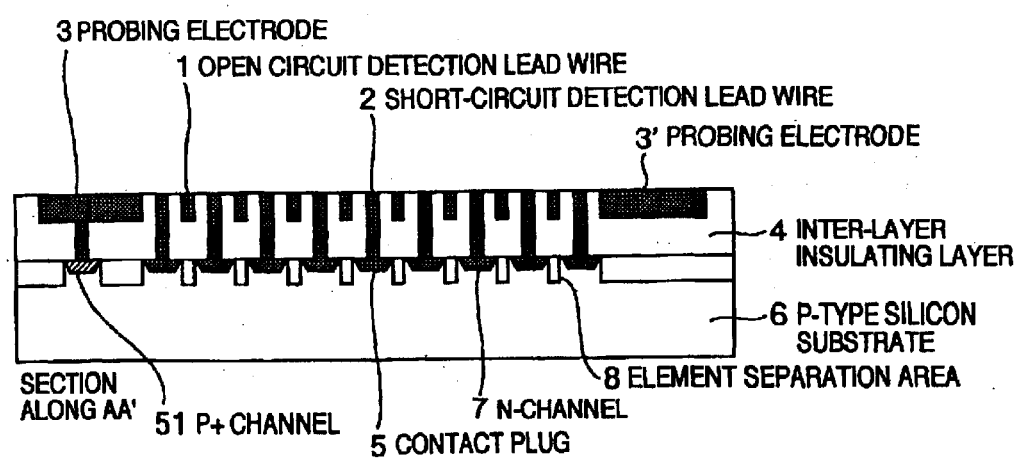

- 3 PROBING ELECTRODE
- 1 OPEN CIRCUIT DETECTION LEAD WIRE
- 2 SHORT-CIRCUIT DETECTION LEAD WIRE
- 3' PROBING ELECTRODE
- 4 INTER-LAYER INSULATING LAYER
- 6 P-TYPE SILICON SUBSTRATE
- 8 ELEMENT SEPARATION AREA
- SECTION ALONG AA'
- 51 P+ CHANNEL
- 7 N-CHANNEL
- 5 CONTACT PLUG

14 ORIGINAL PICTURE — 15 COMPARISON PICTURE = 16 DIFFERENCE PICTURE

80 USER TERMINAL

PHOTOMASK FOR TEST WAFERS

This is a division of application Ser. No. 10/126,263 filed Apr. 19, 2002.

FIELD OF THE INVENTION

The present invention relates to technique for testing and manufacturing electronic devices such as semiconductor devices, electric circuit boards and CCD devices.

BACKGROUND OF THE INVENTION

Recently, in order to increase competitive power of products in a market, it is indispensable to shorten a development term of products. However, since it takes several tens of days from setting of products on a manufacturing line to complete test of electrical characteristics for judging whether products are good or not upon completion of the products, it is late even if a counter plan is considered after reception of the tested results of the electrical characteristics.

In order to solve the above problem, there is a method that in development of products a common process is divided into blocks and electrical test is made in each block, so that its tested result is fed back to the process to establish the process of the block early. A sample for monitoring the block is named a test structure, a short loop monitor or a test element group (TEG). Hereinafter, these are named test structures generically. An example of the test structure is disclosed in "Integrated Circuit Manufacturability, IEEE PRESS, pp. 26–29".

As technique of specifying a short-circuited position occurring in the test structure, there is the technique of detecting difference in a voltage state on a surface of a wiring pattern by means of irradiation of a charged particle beam such as an electron beam or focused ion beam, that is, the technique of obtaining voltage contrast to detect a position of a defect. An example of the test structure utilizing this technique is disclosed in "Microelectronic Test Structures for Rapid Automated Contactless Inline Defect Inspection, IEEE Transactions on Semiconductor Manufacturing, Vol. 10, No. 3, August 1997".

However, in the above prior art, it is necessary to irradiate all of test structure patterns in a wafer with a charged particle beam and accordingly a lot of test time is required. Particularly, when defects are few in one wafer, the ratio of normal test structure patterns occupying the wafer is increased that much and the time for testing the normal test structure patterns occupies the most part in spite of the test for detecting unusual portions, so that work efficiency is reduced.

More particularly, in the prior art, the test structure for specifying a short-circuited position efficiently is not studied sufficiently. Accordingly, a considerable time is taken for test and analysis and the time required to feed the result thereof back to a manufacturing line is delayed, so that the yield cannot be improved effectively. Particularly, the test structure intended to effectively use the voltage contrast method has not been studied sufficiently.

Further, in the prior art, short circuit and open circuit cannot be discriminated from each other efficiently and a considerable time is taken for test and analysis thereof in the same manner as above, so that the time required to feed the result thereof back to a manufacturing line is delayed and the yield cannot improved effectively.

SUMMARY OF THE INVENTION

It is an object of the present invention to improve the efficiency of the test using the test structure to thereby improve the yield.

In order to attain the above object, according to the present invention, the manufacturing method of an electronic device for performing test using a first lead wire disposed on an insulating layer formed in a substrate and a second lead wire electrically connected to the substrate and disposed on the insulating layer and managing the electronic device using the tested results to be manufactured, comprises a step of testing whether the first lead wire is disconnected or not by measuring an electric resistance between both ends of the first lead wire and a step of testing whether the first and second lead wires are short-circuited or not by measuring an electric resistance between the first lead wire and the substrate.

Further, according to the present invention, the manufacturing method of an electronic device for performing test using a first lead wire disposed on an insulating layer formed in a p-type silicon substrate and a second lead wire electrically connected through an n-channel formed in the p-type silicon substrate and disposed on the insulating layer and managing the electronic device using the tested results to be manufactured, performs test as to whether the first and second lead wires are short-circuited or not by measuring an electric resistance between the first lead wire and the p-type silicon substrate.

BRIEF DESCRIPTION OF THE DRAWINGS

FIGS. 3A and 3B illustrate a method of locating short-circuit defect;

FIGS. 15A and 15B show a test structure according to the present invention;

DESCRIPTION OF THE EMBODIMENTS

Embodiments of the present invention are now described with reference to the accompanying drawings.

Figure 1A:
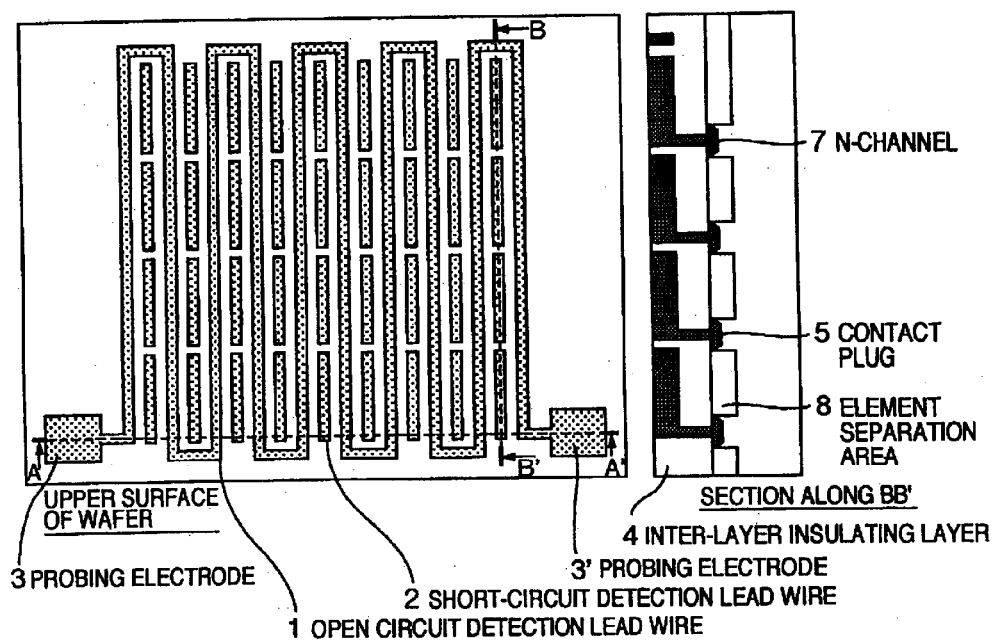
FIGS. 1A and 1B show a test structure according to the present invention.
Figure 1B:
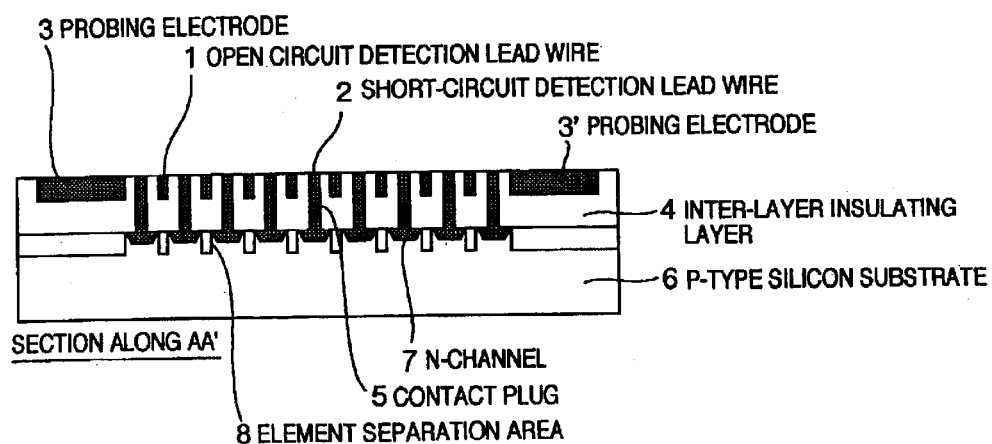

FIGS. 1A and 1B show a test structure capable of detecting not only short-circuit defect but also open circuit defect. Although not shown, a plurality of test structures are disposed on the whole surface of a wafer or together with a chip constituting a final product and generally disposed together with a different test structure for performing another test such as test for defect in contact.

First, a open circuit detection lead wire 1 having a desired width and length is disposed meandering in a first wiring layer. Probing electrodes 3 and 3' are connected to both ends of the lead wire 1 so that a wiring resistance is electrically measured to confirm the presence of open circuit.

A plurality of short-circuit detection lead wires 2 are disposed in parallel to the longitudinal direction of the lead wire 1 (in the vertical direction of FIG. 1) in spaces between lengthwise-arranged lead wire portions of the lead wire 1 so that spaces between adjacent lead wires are set up to a desired dimension. The lead wire 1 and the lead wires 2 are electrically insulated by means of an inter-layer insulating layer 4. The plurality of short-circuit detection lead wires 2 are connected to n-channels 7 which are n-doped (ion-implanted) into the upper surface of a P-type silicon substrate 6 through contact plugs 5. The plurality of n-channels 7 are electrically insulated by means of trench isolation area 8 (which can be omitted if the n-channels are insulated without the areas) so that the lead wires 2 are maintained to be insulated. The space between lead wires and the width of the lead wires are set up to representative dimensions in a wiring process to be monitored, that is, 0.1 to 1 micrometer. In order to monitor the frequency of occurrence of defects for each magnitude of the defects, a plurality of test structures may be provided with lead wires each having different wiring space. A unit constituting one test structure is hereinafter referred to as a module.

Figure 2:
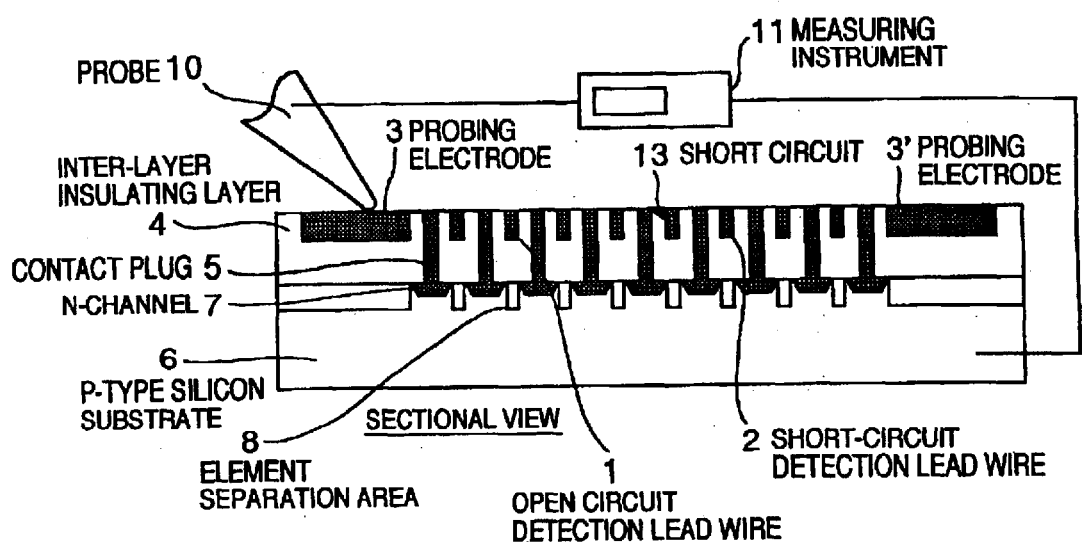
FIG. 2 illustrates a method of detecting short-circuit defect.

Referring now to FIG. 2, a method of detecting short-circuit defect of lead wires is described.

First, as shown in FIG. 2, one probe 10 is brought into contact with the probing electrode 3 connected to the open circuit detection lead wire 1. The other probe is brought into contact with a substrate electrode (not shown) being in contact with the P-type silicon substrate 6 to measure a resistance therebetween by means of a measuring instrument. At this time, a voltage at the substrate is set up to be higher than a voltage at the probe 10. That is, when the substrate voltage is a ground voltage, the probe 10 is set up to a negative voltage and when the voltage at the probe 10 is a ground voltage, the substrate voltage is set up to a positive voltage. The reason is that the n-channels 7 disposed in the P-type channel silicon substrate 6 constitute the diode function and when a short circuit exists, a current (a forward current of diode) is apt to conduct from the substrate electrode not shown through the P-type silicon substrate 6 to the n-channel at a short-circuited portion 13. When the current conducts, the current leaks through a contact plug 5, the short-circuit detection lead wires 2 and the short circuit 13 to the open circuit detection lead wire 1 and accordingly the leakage current is detected by the probe 10 being in contact with the probing electrode 3 to thereby detect a short-circuit defect.

Next, a method of specifying a defect occurrence position of the test structure judged as being short-circuit defective by the electrical test, that is, a specifying method by the voltage contrast method is described.

Referring now to FIG. 3, a method of detecting short-circuited portion by means of the voltage contrast method is described.

When the surface of the open circuit detection lead wire 1 is irradiated with a charged particle beam 20, secondary electrons 21 are emitted from the open circuit detection lead wire 1. The open circuit detection lead wire 1 and the P-type silicon substrate 6 are electrically insulated from each other, although when the open circuit detection lead wire 1 is connected to the ground through a conductive probe 22, the open circuit detection lead wire 1 turns to make it possible to be supplied with electrons, so that secondary electrons 21 are emitted in large quantities. The emitted secondary electrons 21 are detected by a detector 23 and are subjected to desired processing in the signal processing unit 24, so that a scanned picture having bright contrast of the charged particle beam 20 can be displayed in a display unit 25. On the other hand, the short-circuit detection lead wires 2 having no short circuit are electrically connected to the P-type silicon substrate 6 through the contact plug 5 and the n-channels 7, while the diode characteristic is maintained by forming the n-channels 7 in the P-channel silicon substrate 6, so that electrons are difficult to be supplied to the short-circuit detection lead wires 2. Accordingly, secondary electrons 21 are emitted from the surface of the short-circuit detection lead wires 2 temporarily, while since the secondary electrons 21 consumed are not supplied from the P-type silicon substrate 6, the short-circuit detection lead wires 2 are charged up, so that the contrast is dark. Conversely, when short-circuit defect is present, the lead wire having the short circuit 13 is electrically connected to the open circuit detection lead wire 1 to have the substantially same voltage as that of the lead wire 1 and accordingly secondary electrons are emitted in large quantities to obtain bright contrast in the same manner as the open circuit detection lead wire 1. Consequently, the short-circuit detection lead wire 2 having the short circuit is detectable. In FIG. 3, the electrode is connected to the ground through the probe in order to obtain a voltage contrast picture, although it may be connected to the substrate within the internal circuit of the test structure or a difference in volume of the conductor 10 may be utilized to differentiate the charged voltage (an amount of emitted secondary electrons determined by the charged voltage) so that a position of open circuit or short circuit can be detected as difference in the voltage contrast.

Figure 4A:
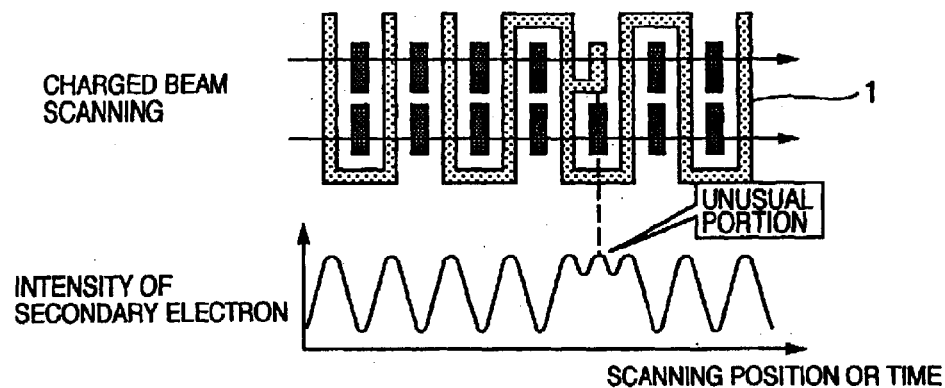
FIGS. 4A, 4B and 4C illustrate a scanning method and test algorithms.

As the basic test method using the contrast picture, there are a line scanning method and a comparison method of two-dimensional scanned pictures. The line scanning method is a recognition method using signal processing by one-dimensional line scanning as shown in FIG. 4A. Change of irregularity of a signal period in the voltage contrast of the short-circuit detection lead wires 2 is captured or detected to specify a short-circuited portion. The Fourier transformation or the like is used to calculate a period of a main component in a normal portion and extract a disordered portion of the period as defect. Alternatively, a period or an amplitude of a signal waveform in a normal portion is previously calculated to thereby recognize or detect a unusual period or amplitude caused by short circuit and coordinates thereof are calculated to be stored or short circuits detected is counted. Occurrence condition of defects can be monitored by the number of counted defects and short-circuited portions can be reviewed on the basis of the coordinated of defects by an electron microscope. In the embodiment, the short-circuit detection lead wires 2 of the test structure are arranged at the same pitch in the vertical direction (in the lengthwise direction of the lead wires). Accordingly, the scanning by the charged beam can be thinned out at predetermined intervals as shown by arrow of FIG. 4A, so that positions where short-circuit and open circuit defects exist in test structure can be specified in a short time.

Figure 4B:
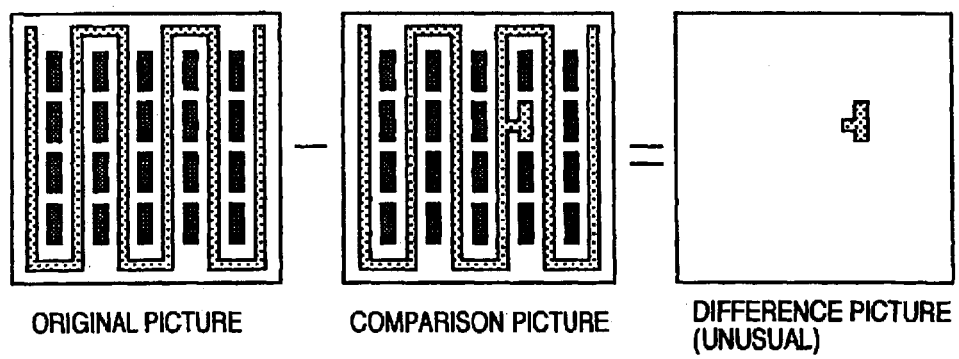

Further, as shown in FIG. 4B, the comparison method of two-dimensional scanned pictures takes in two-dimensional pictures successively and compares the respective pictures with pictures of different areas to make a defective portion prominent. More particularly, two-dimensional pictures obtained by observing three test structure modules are used. A difference picture 28 of an original picture 26 of test structure (a) and a comparison picture 27 of test structure (b) is obtained and a difference picture 28' of the original picture 26 of test structure (a) and a comparison picture 29 of test structure (c) is then obtained to confirm whether the difference picture exceeding a threshold is present or not, so that which picture has an unusual portion or which test structure has a defect is judged (in this example, test structure (b) has a defect) and coordinates thereof are calculated. In order to improve the sensitivity of this test, a method of connecting one end of the open circuit detection lead wire 1 to the ground by bringing the probe into contact with the probing electrode 3 or 3' or a method of connecting one end of the open circuit detection lead wire 1 to the ground within an internal circuit previously is effective for emphasis of the contrast, while when a difference in volume between the open circuit detection lead wire 1 and the short-circuit detection lead wire 2 is sufficient, it is not necessary to bring the probe into contact with the proving electrode 3 or 3' to connect it to the ground.

Figure 5:
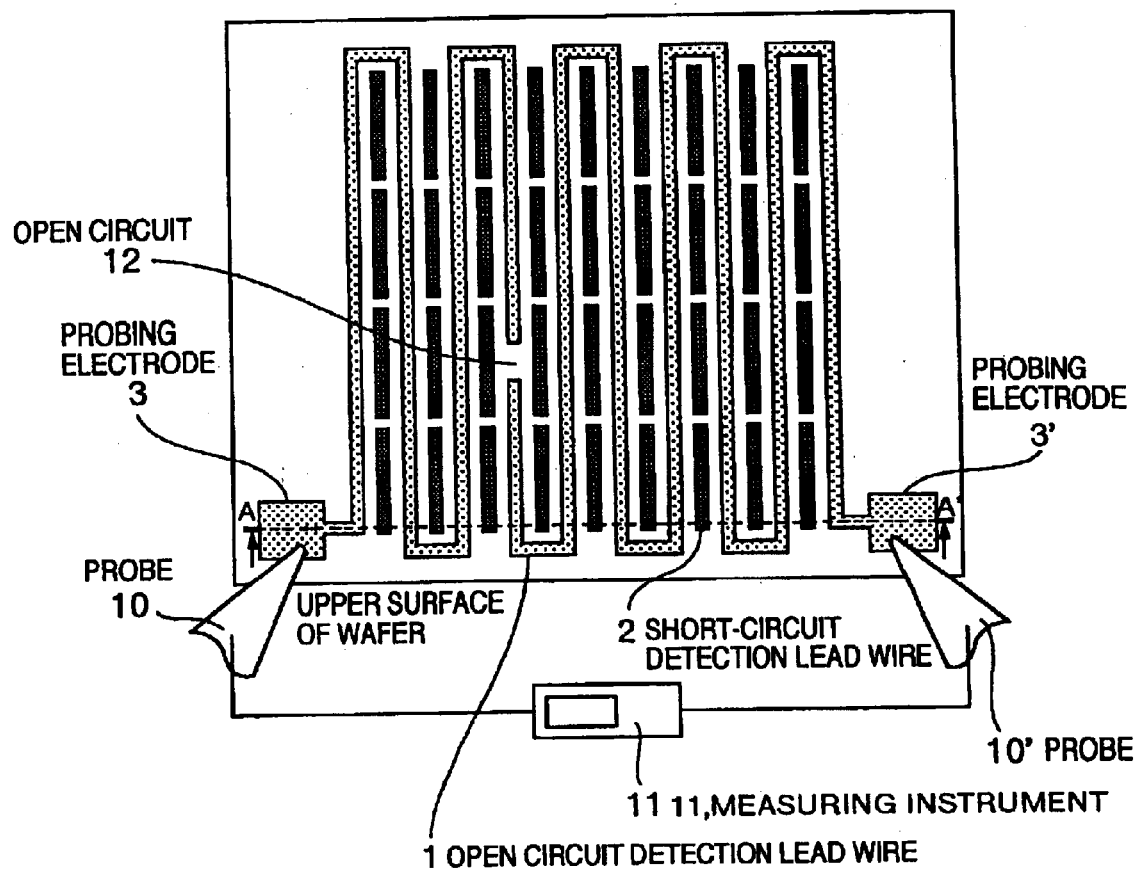
FIG. 5 illustrates a method of detecting open circuit defect.
Figure 6A:
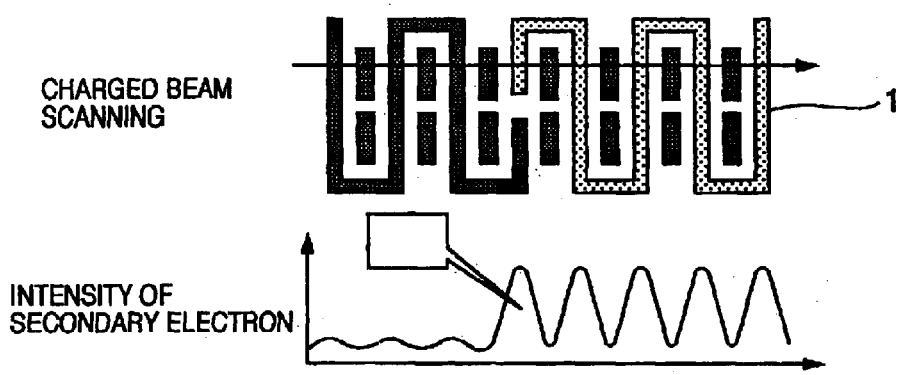
FIGS. 6A, 6B and 6C illustrate a scanning method and test algorithms.
Figure 6B:
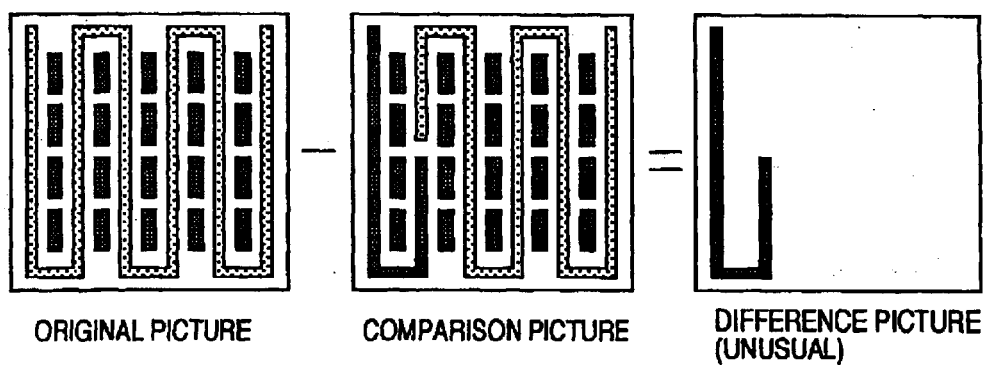
Figure 6C:
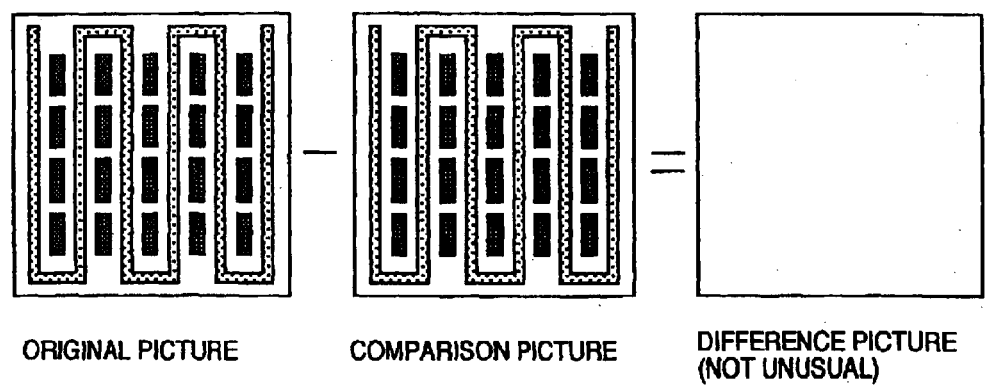

When a open circuit defect is detected using the test structure, as shown in FIG. 5, the probe 10 is brought into contact with the probing electrodes 3 and 3' connected to both ends of the open circuit detection lead wire 1 and a wiring resistance is measured by the measuring instrument 11. When a open circuit 12 exists, the resistance of the lead wire is higher than a target wiring resistance prescribed in a specification and accordingly the presence of the open circuit defect is confirmed. Further, as shown in FIGS. 6A, 6B and 6C, when the voltage contrast method is used to specify a disconnected portion, a part of the open circuit detection lead wire 1, that is, a portion where the open circuit 12 occurs becomes dark contrast when a module which is an object to be tested is irradiated with the charged particle beam 20 as described above. An end portion of the dark contrast portion (in FIGS. 6A, 6B and 6C, the open circuit 12 exists at rightmost and uppermost coordinates) can be captured to specify its position easily.

Figure 7A:
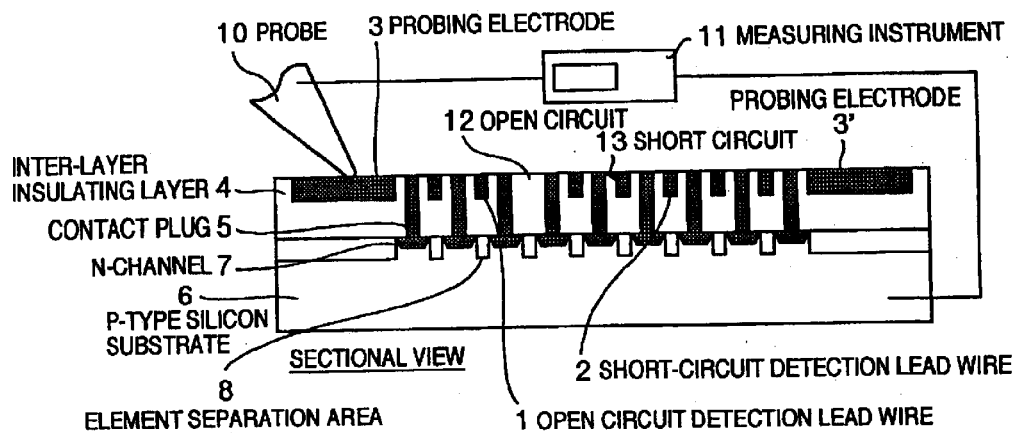
FIGS. 7A and 7B illustrate a method of detecting open circuit defect and short-circuit defect.
Figure 7B:
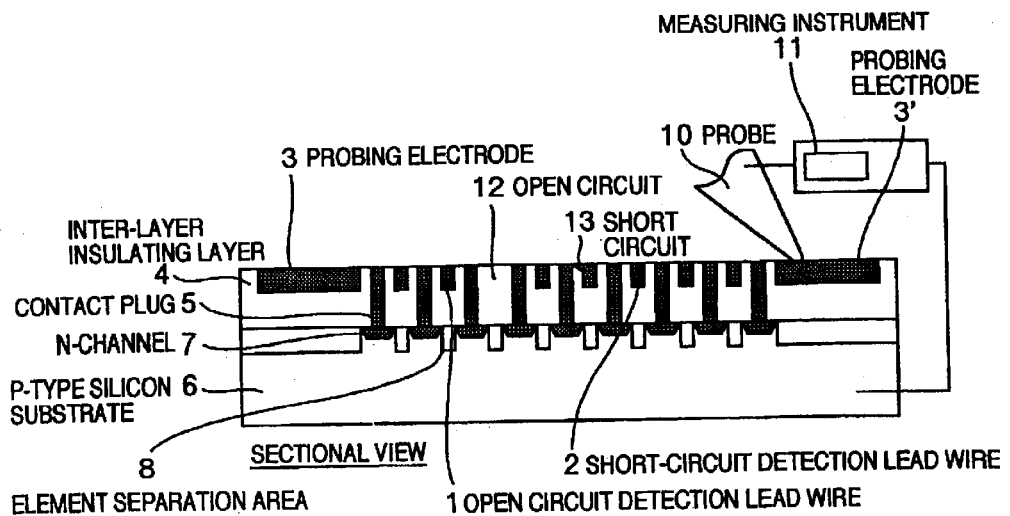

Referring now to FIGS. 7A and 7B, a method of detecting defect when open circuit and shirt circuit occur in one module is described in detail.

First, although not shown, as described above, the probe 10 is brought into contact with the probing electrode 3 connected to both ends of the open circuit detection lead wire 1 to measure a resistance by the measuring instrument 11 and the presence of the open circuit 12 is confirmed. Next, as shown in FIGS. 7A and 7B, a resistance between the substrate electrode (not shown) and the probe 10 brought into contact with the probing electrode 3 connected to one end of the open circuit detection lead wire 1 is measured to confirm the presence of short circuit 13. In the example shown in FIG. 7A, since the open circuit 12 exists, the short circuit 13 cannot be confirmed. Accordingly, as shown in FIG. 7B, a resistance between the substrate electrode and the probe 10 brought into contact with the other probing electrode 3' connected to the other end of the open circuit detection lead wire 1 is measured, so that the presence of short circuit 13 can be confirmed. Consequently, even if the open circuit 12 and the short circuit 13 exist in one module simultaneously, exact test can be attained.

Figure 8:
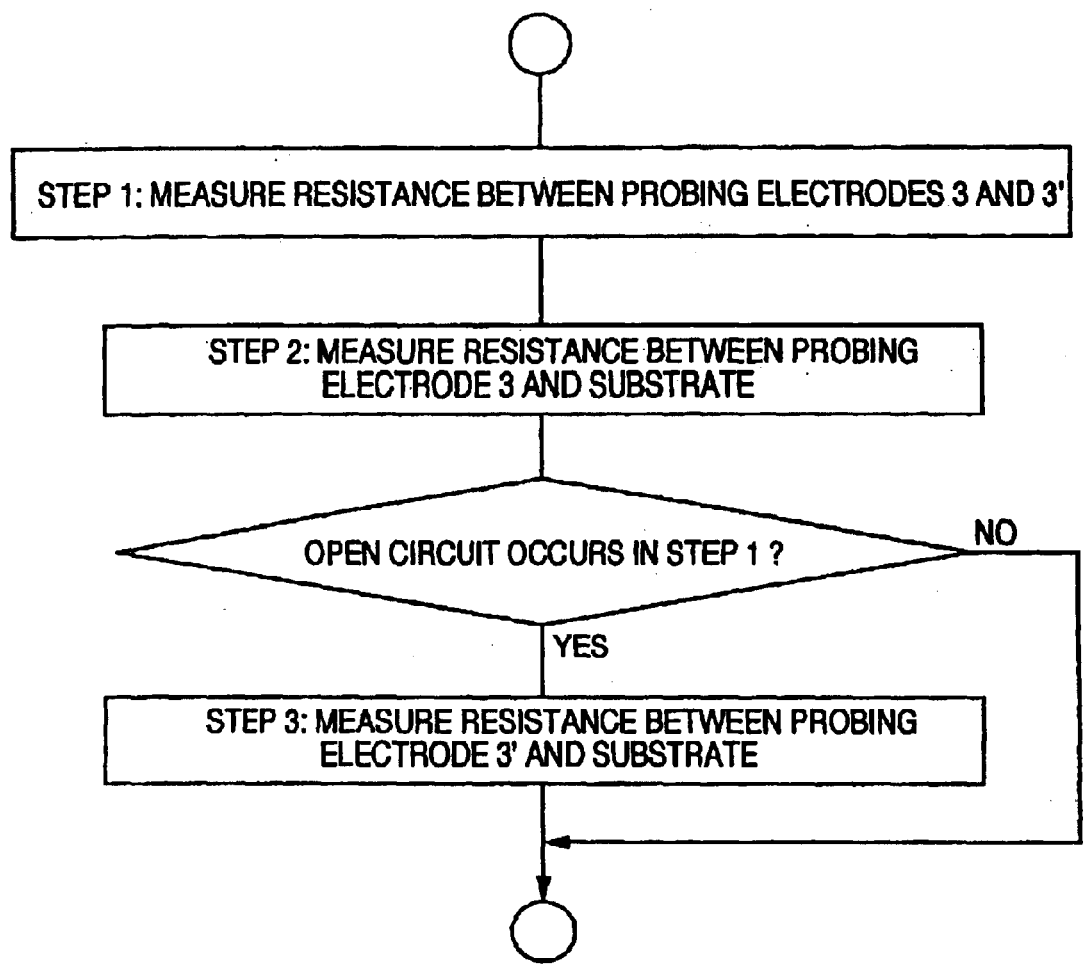
FIG. 8 is a flow chart showing a procedure of testing open circuit defect and short-circuit defect.

The above-mentioned procedure is summarized in FIG. 8.

First, a resistance between the probing electrodes 3 and 3' connected to both ends of the open circuit detection lead wire 1 is measured to test whether a open circuit exists or not (step 1). Then, a resistance between one of the probing electrodes and the substrate electrode is measured to test whether short circuit exists or not (step 2). When the open circuit is detected in step 1, a resistance between the other probing electrode and the substrate electrode is measured to test whether the short circuit exists or not (step 3). With this series of procedures, even when open circuit and short circuit exist in one module simultaneously, the test thereof can be performed. effectively.

Figure 9A:
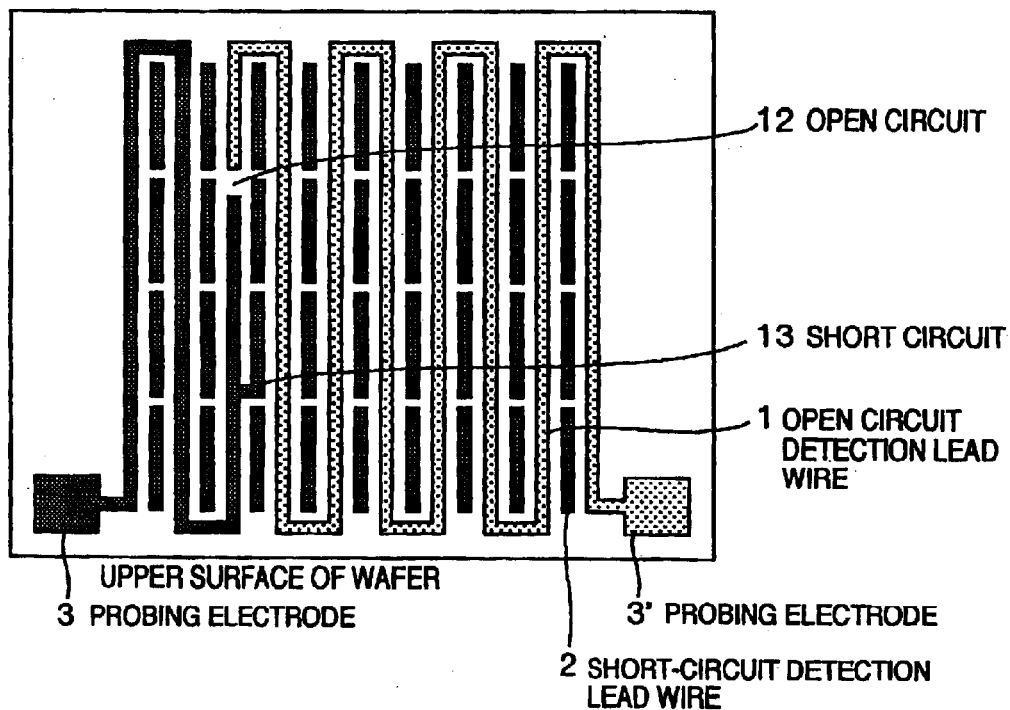
FIGS. 9A and 9B illustrate a method of detecting open circuit defect and short-circuit defect.

Referring now to FIG. 9, a method of specifying-a short-circuited portion when open circuit defect and short circuit defect exist in one module is described. With the test structure, the voltage contrast method can be used to obtain not only the contrast for short circuit but also the contrast for open circuit simultaneously, so that a open circuit position and a short circuit position can be detected simultaneously.

First, in the same manner as the above, when the module which is an object to be tested is irradiated with the charged particle beam 20, a portion of the open circuit detection lead wire 1, that is, a portion in which open circuit 12 exists has dark contrast and accordingly the position of the open circuit can be specified. Further, since the portion in which short circuit 13 occurs is electrically connected to the open circuit detection lead wire 1, the portion acquires sufficient capacity to have bright contrast and the position of the short circuit can be specified.

Figure 9B:
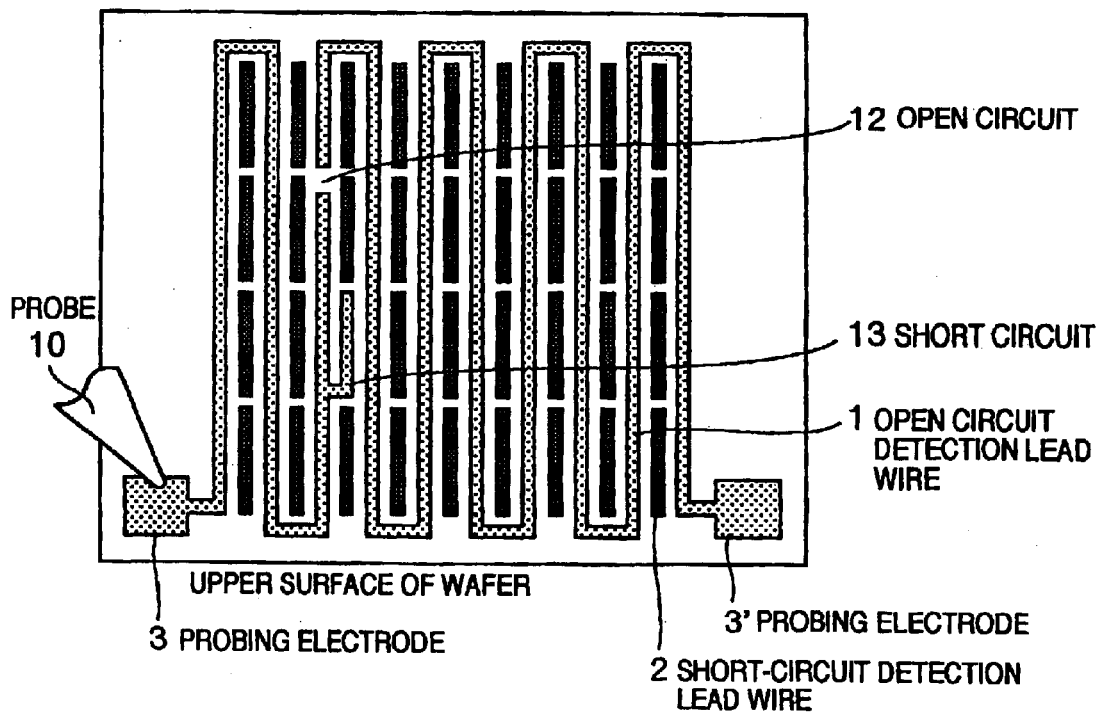

The contrast of the open circuit detection lead wire 1 divided by open circuit is determined in accordance with a length of the divided lead wire. When the length is short, a charged voltage is increased and the contrast thereof is dark. When a short-circuited portion exists in the divided portion, the contrast of the short-circuited portion is assimilated into the dark contrast of the open circuit detection lead wire 1 and it is sometimes difficult to make the short-circuited portion prominent. In such case, for example, as shown in FIG. 9B, the probe is brought into contact with the probing electrode 3 connected to the open circuit detection lead wire 1 on the dark contrast side to apply a reference voltage thereto, so that the open circuit detection lead wire 1 is varied to bright contrast to make it possible to specify the short-circuited portion 13 as described above.

Figure 10:
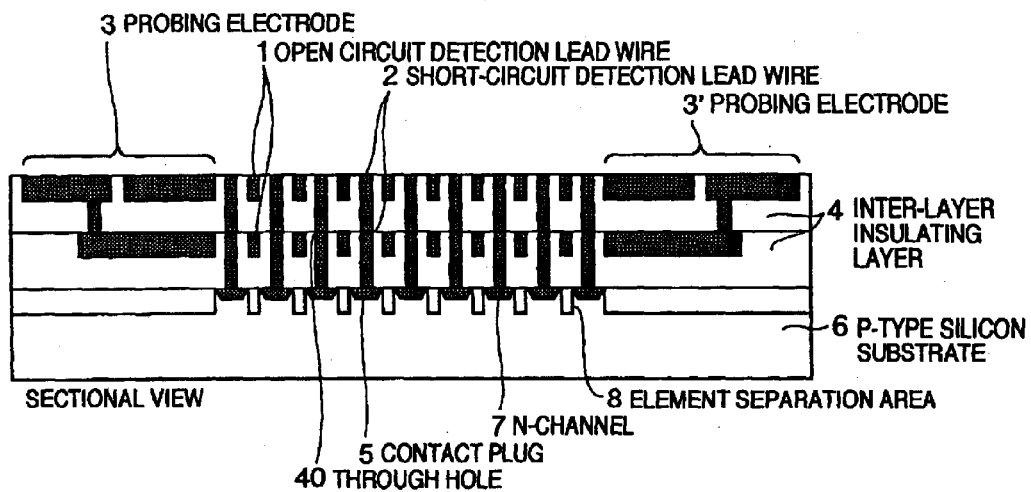
FIG. 10 shows a test structure according to the present invention.

FIG. 10 shows another test structure for detecting short circuit defect.

The test structure shown in FIG. 10 has a two layered structure constituted by the above-mentioned test structures. The short-circuit detection lead wires 2 of an upper layer are connected to those of a lower layer by means of through-holes 40 so that the lead wires 2 are conductive to the P-type silicon substrate through the n-channels, so that a short circuit position can be specified by means of the voltage contrast method. The open circuit detection lead wires 1 are maintained to be insulated in the upper and lower layers, so that respective defect occurrence states can be monitored. Further, even when the upper layer is placed on the lower layer, the probing electrodes 3 and 3' of the upper and lower layers may be connected by means of through-holes 40 to each other so that the defect occurrence state in the lower layer can be measured. The test structure of the embodiment is effective for monitoring variation of the defect occurrence state due to the multi layered structure. In the test structure, after the lower layer has been tested, the upper layer is formed and tested. At this time, the wiring resistance in the lower layer can be measured to thereby test influence caused by forming the upper layer. When it is considered that the short-circuit detection lead wires 2 of the upper layer are electrically connected to those of the lower layer by means of through-holes 40, it is desirable that the width of the short-circuit detection lead wires 2 are widened to make it possible to absorb positional deviation upon formation of the through-hole although not shown. This can be applied to the contact plug 5 similarly. Accordingly, it is desirable that the width of the short-circuit detection lead wires 2 is formed to be wider than that of the open circuit detection lead wire 1. This is desirable in view of the fact that the short-circuit detection lead wires are difficult to open circuit. In this case, it is needless to say that the dimension are decided in consideration of a difference in volume of the open circuit detection lead wire 1 and the short-circuit detection lead wire 2 in the voltage contrast method.

Figure 11:
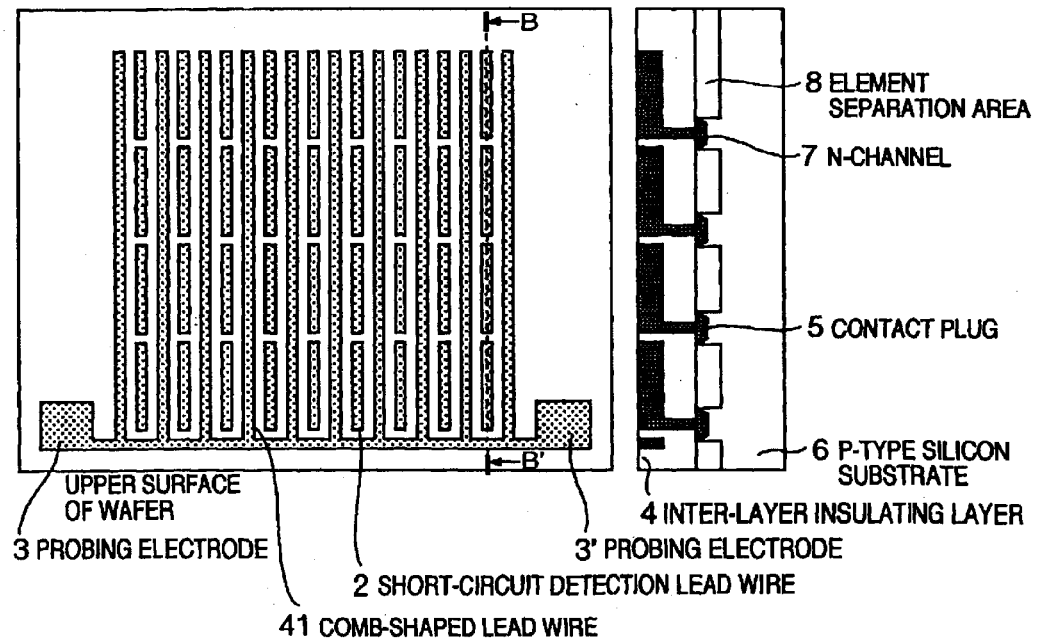
FIG. 11 shows a test structure according to the present invention.

FIG. 11 shows another test structure for detecting short circuit defect.

The test structure shown in FIG. 11 is limited to have only the function of detecting only short circuit defect and includes a comb-shaped lead wire 41 and the short-circuit detection wires 2 disposed in spaces between lead wire portions of the comb-shaped lead wire 41. When only shirt circuit is detected in this manner, only the comb-shaped lead wire set up to a common voltage and the short-circuit detection lead wires being non-conductive to the comb-shaped lead wire are required.

Figure 12:
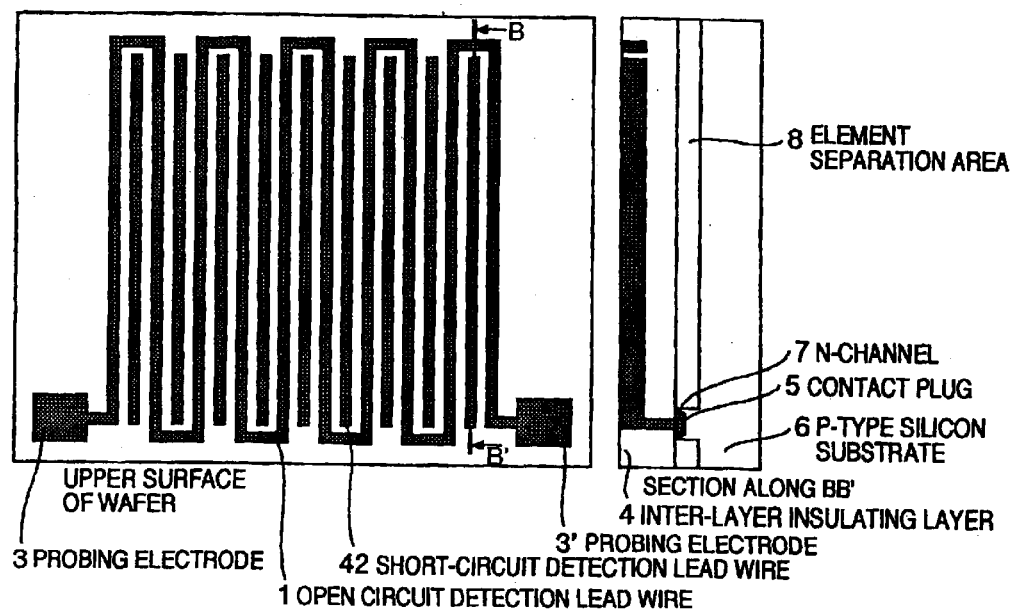
FIG. 12 shows a test structure according to the present invention.

FIG. 12 shows another test structure for detecting short circuit defect.

The test structure shown in FIG. 12 includes a single short-circuit detection lead wire 42 instead of the plurality of short-circuit detection lead wires. When a defective position is specified by the line scanning, the number of scanning lines can be reduced to thereby shorten a specifying time. Further, although not shown, if a plurality of contact plugs 5 are formed to the single short-circuit detection lead wire 42, it can cope with even the case where the short-circuit detection lead wire 42 is disconnected.

Figure 13:
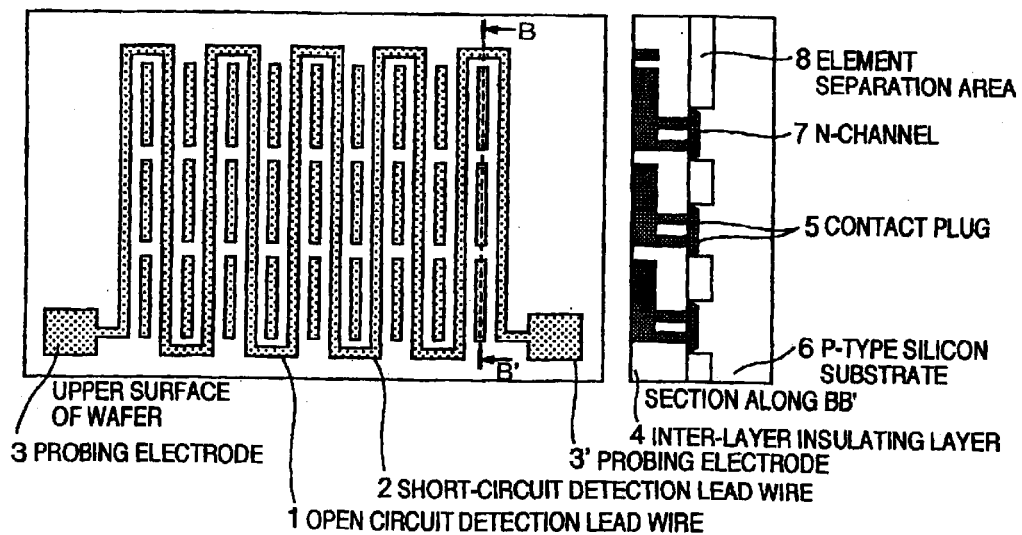
FIG. 13 shows a test structure according to the present invention.

FIG. 13 shows another test structure for detecting short circuit defect.

The test structure shown in FIG. 13 includes a plurality of contact plugs 5 connected to the short-circuit detection lead wires 2. Even when the short-circuit detection lead wires 2 are short-circuited in case where the contact plugs 5 are non-conductive, the short circuit defect is passed over by the electrical test. In order to avoid such disadvantage, an additional or redundant contact plug can be provided to measure whether defect is present or not with accuracy. Further, in the same manner as described above, it can cope with the case where the short-circuit detection lead wire is disconnected.

Figure 14A:
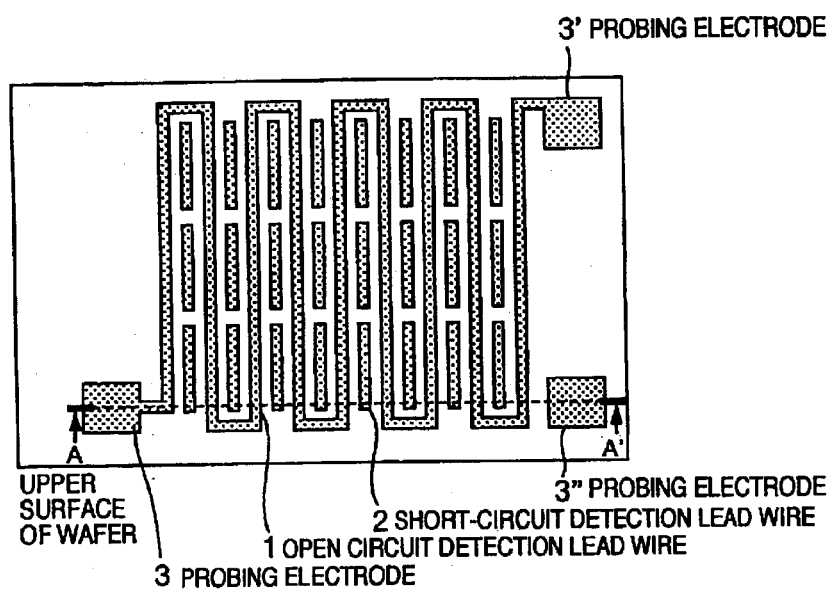
FIGS. 14A and 14B show a test structure according to the present invention.
Figure 14B:
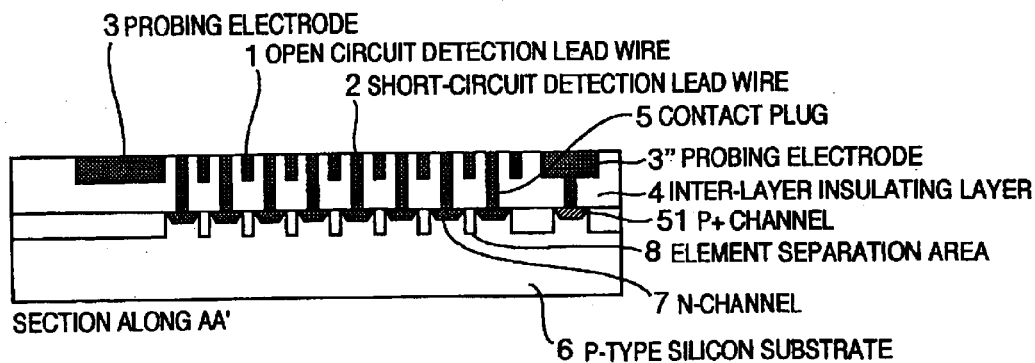

FIG. 14 shows another test structure for detecting short circuit defect.

The test structure shown in FIG. 14 includes a probing electrode 3" connected through a p+ channel 51 and the contact plug 5 to the P-type silicon substrate 6 so as to apply the substrate voltage thereto. This is effective when no current is taken out from the substrate.

FIG. 15 shows another test structure for detecting short circuit defect.

The test structure shown in FIG. 15 includes the probing electrode 3 at one end of the open circuit detection lead wire 1 connected through the p+ channel 52 and the contact plug 5 to the P-type silicon substrate 6. When the external appearance test by SEM is performed, defect in test due to picture drift caused by electrification of the open circuit detection lead wire 1 can be reduced. The p+ channel 52 is implanted with impurity having concentration higher than that of the P-type silicon substrate 6. (the p+ channel 52 may be omitted so that the probing electrode 3 is electrically connected through only the contact plug 5 to the P-type silicon substrate.)

All of the test structures described so far use the P-type silicon substrate, while the test structure can also use an N-type semiconductor substrate. In this case, however, it is necessary to provide a P-type well area and form the channel area within the P-type well area. Further, in any of the embodiments, only test structure may be mounted on the whole surface of wafer or test structures and product chips may be mixed in the wafer. In this case, test structures may be disposed in wafer at uniform pitch or may be disposed on concentric circles each having different radius or may be disposed on scribe line. In addition, it is needless to say that even a combination of any embodiments is effective.

Further, if the diode effect can be obtained without provision of n channel and flow of electrons can be controlled, it is not necessary to form the n channel.

Moreover, various patterns of open circuit detection lead wire and short-circuit detection lead wire have been disclosed, while the wiring patterns are not limited thereto and any wiring pattern may be used as far as a current flows in a fixed direction from the lead wires to the substrate or from the substrate to the lead wires through the contact plug 5 when the short-circuit detection lead wire is short-circuited with any lead wire.

Further, when the test for the external appearance or the current absorption method is used to detect a short-circuited position without using of the voltage contrast method, it is not necessary to form the diode function and only conduction is required. Since short circuit and open circuit can be judged easily in one module by this method, test efficiency and manufacturing yield are improved.

Figure 16:
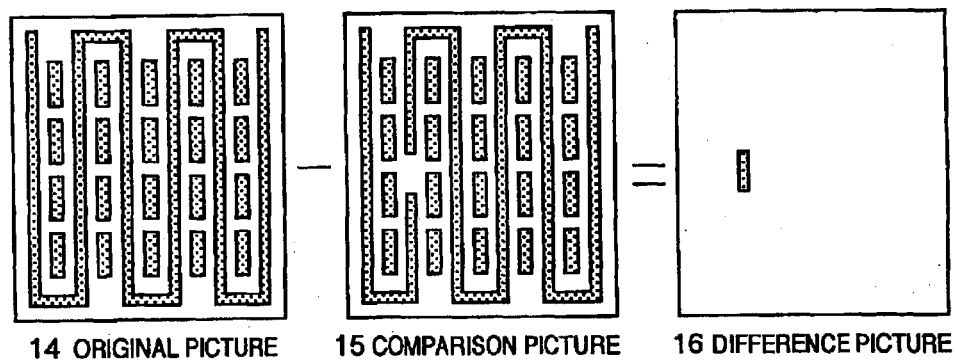
FIG. 16 illustrates a method of detecting open circuit defect by means of an inspection apparatus.

FIG. 16 illustrates a method of specifying short-circuited portion or a disconnected portion by means of the inspection apparatus. In this method, the inspection apparatus (not shown) is used to irradiate the surface of the test structure with light or the charged particle beam such as electrons and reflected light (bright field light or dark field light) or secondary electrons or reflected electrons are detected to obtain an observed picture (original picture 14) having a surface structure of test structure. Further, one or two observed results (comparison picture 15) of another area are obtained and an unusual portion in a difference picture 16 therebetween is judged to confirm the presence of defect. FIG. 16 shows an example of detecting open circuit.

Figure 17:
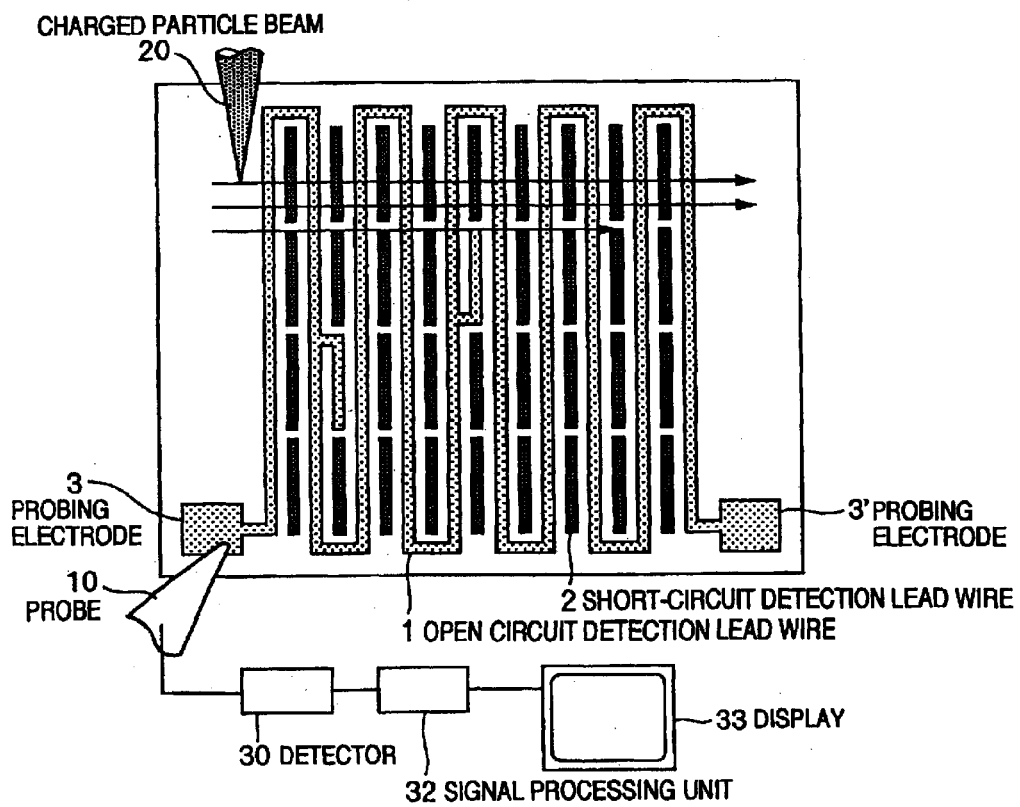
FIG. 17 illustrates a method of detecting shirt-circuit defect by means of a current absorption method.

FIG. 17 illustrates a method of specifying defective portion by means of the absorption current method.

First, the probe 10 is brought into contact with one end of the probing electrode 3 connected to the open circuit detection lead wire 1. When the surface of the test structure is irradiated with the charged particle beam 20 such as electron beam, a difference of discharged amount of secondary electrons 21, that is, a balance of current can be detected by the probe. Change of current detected by a detector 30 is subjected to desired processing in a signal processing unit 32 to be displayed as a scanned picture in a display unit 33. The absorption current method uses the above-mentioned principle. When a position of short circuit defect is specified, a current does not flow through the probe in the case of the normal short-circuit detection lead wire, while since a current flows at a short-circuited portion, the short circuit defect can be detected. In the same manner as the above-mentioned voltage contrast method, the line scanning is made using irradiation of the charged particle beam to detect a discontinuous point or an absorbed current picture is used as a two-dimensional picture synchronized with scanning to be compared with a normal picture to make it possible to specify a defective portion. Further, the charged particle beam 20 is used to obtain an enlarged picture of a short-circuited portion effectively. When a open circuit position is specified, change of an absorbed current amount can be confirmed at a disconnected portion and coordinates thereof are stored in the same processing as in the voltage contrast method or the charged particle beam 20 used for irradiation can be used to obtain an enlarged picture of the disconnected portion as it is.

Figure 20A:
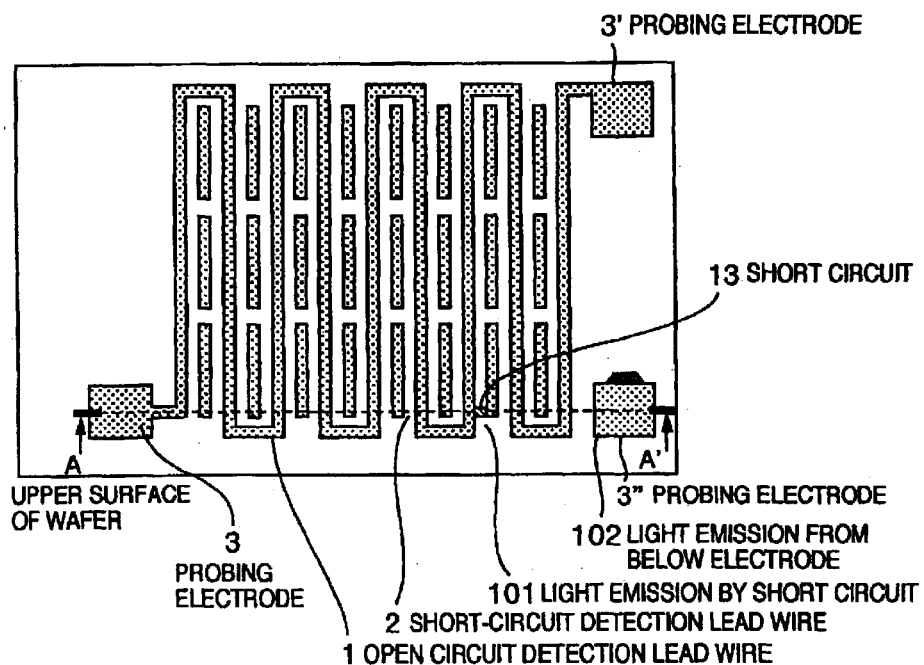
FIGS. 20A and 20B illustrate a method of detecting shirt-circuited portion by means of an emission microscope.
Figure 20B:
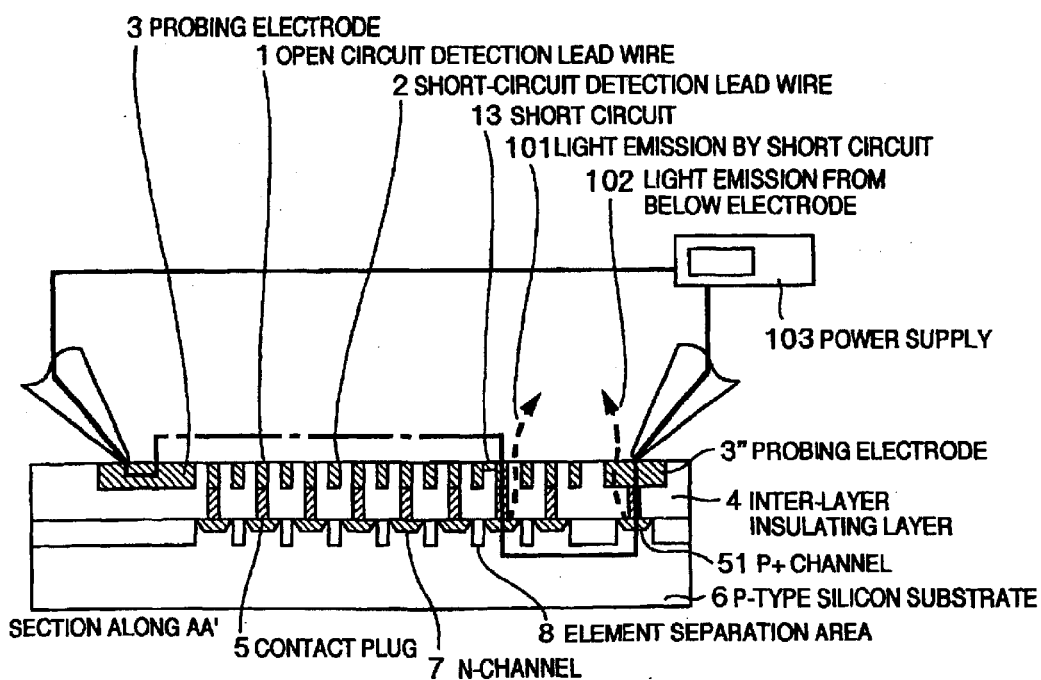

FIG. 20 illustrates a method of specifying short-circuited portion by means of an emission microscope.

First, the probe 10 is brought into contact with the probing electrodes 3 and 3" to connect the probing electrodes 3 and 3" to a power supply 103. As described above in the embodiments, if short circuit 13 exists in the test structure, a current flows from the power supply 103. At this time, since the current flows through the PN junction formed by the P-type silicon substrate 6 and the n-channel 7, a photon mission occurs in the PN junction (light emission 101 by short circuit). The lead wires are formed on the upper layer, while the intensity of emitted light caused by the forward current is generally large and the emitted light leaks from between the lead wires. The emission microscope is used to catch the emitted light, so that the presence and the occurrence position of short circuit 13 can be detected. Thereafter, physical analysis such as SET and TEM is performed on the basis of coordinates obtained above to make it possible to shorten a defect analysis time. At this time, there is the possibility that the luminous phenomenon (light emission 102 from below the electrode) occurs even by the PN junction formed by the p+ channel 51 and the P-type silicon-substrate 6. When the emitted light is not screened by a pad, the emitted light from this portion is not light emitted due to short circuit 13 and accordingly it is not necessary to recognize it as defect or store coordinates thereof.

In the method using the emission microscope described above, not only the position of the short-circuited portion can be specified but also the presence of short circuit can be confirmed by measuring the current flowing in the power supply 103.

Further, even in the case excluding the test structure for catching the emitted light caused by the PN junction formed by the P-type silicon substrate 6 and the n channel 7 described above, the luminous phenomenon can be captured. For example, when the n channel is changed to a p channel and the P-type silicon substrate is changed to an n-type silicon substrate, the luminous phenomenon due to breakdown of the junction can be detected if a voltage exceeding a breakdown voltage of a diode is applied to the probe upon test of short circuit.

Figure 18A:
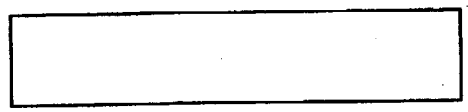
FIGS. 18A to 18M show manufacturing processes of test structure according to the present invention.
Figure 18B:
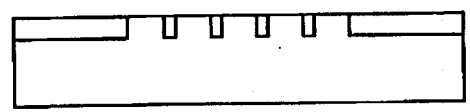
Figure 18C:
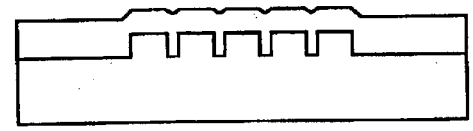
Figure 18D:
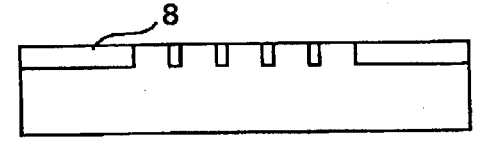
Figure 18E:
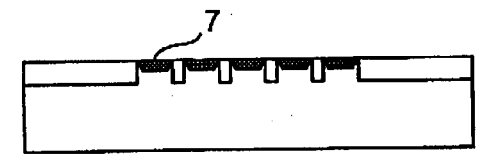
Figure 18F:
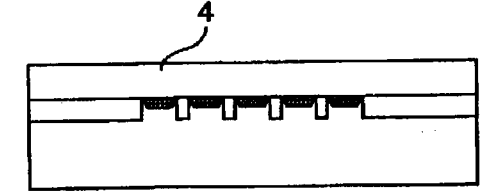
Figure 18G:
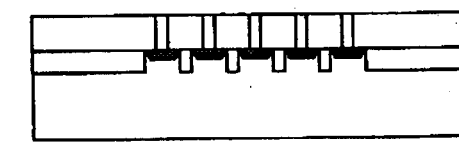
Figure 18H:
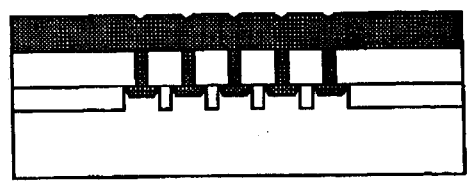
Figure 18I:
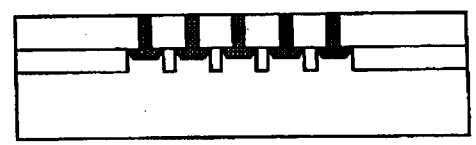
Figure 18J:
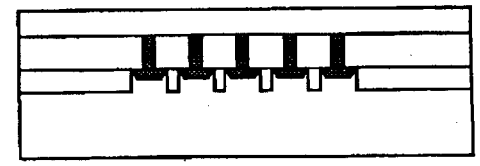
Figure 18K:
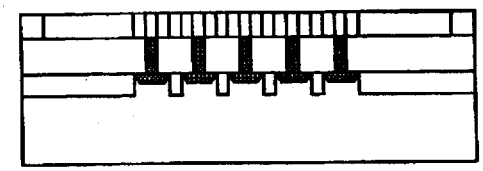
Figure 18L:
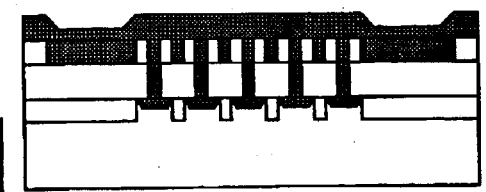
Figure 18M:
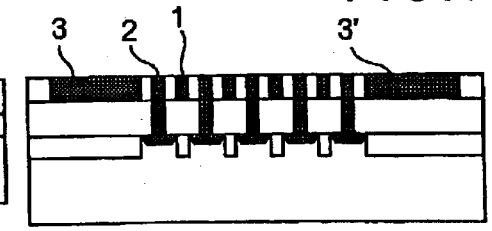

Referring now to FIGS. 18A to 18M, manufacturing processes of the test structure shown in FIG. 1 are described. First, Si wafer is etched to form grooves for the trench isolation areas 8 (FIGS. 18A and 18B) and an oxide layer such as $SiO_2$ is formed on the upper surface of the wafer by means of CVD or the like (FIG. 18C). Excessive portion of the oxide layer is removed by CMP (chemical mechanical polishing) to make the upper surface flat so that a desired element separation areas 8 are formed (FIG. 18D). Next, ion implantation is performed to form the n channels 7 in desired area (FIG. 18E). The inter-layer insulating layer 4 such as $SiO_2$ is deposited on the n-channels 7 (FIG. 18F) and holes for embedding the contact plugs 5 are formed by etching (FIG. 18G). After metal such as W is embedded into the holes, excessive metal material on the upper surface is removed by CMP to form the contact plugs (FIG. 18I). Further, inter-layer insulating layer 4 such as $SiO_2$ is formed on the upper surface (FIG. 18J) and wiring grooves for wiring pattern are formed therein (FIG. 18K). Metal such as Cu is formed in the wiring grooves through a barrier layer for preventing lead wires from spreading, by means of plating or sputtering (FIG. 18L) and excessive metal is removed to make flat by CMP so that the open circuit detection lead wires 1, the short-circuit detection lead wires 2 and the probing electrodes 3 and 3' are formed. The pattern for all of the etching processes is formed by previously forming a resist mask by means of the photolithographic process and removing portion excluding the mask. A part of processes can be changed so that lead wires can be formed of Al or W. It is needless to say that the same problem as that of a product can be extracted from the test structure by forming the test structure by the processes similar to the product to the utmost.

Figure 19:
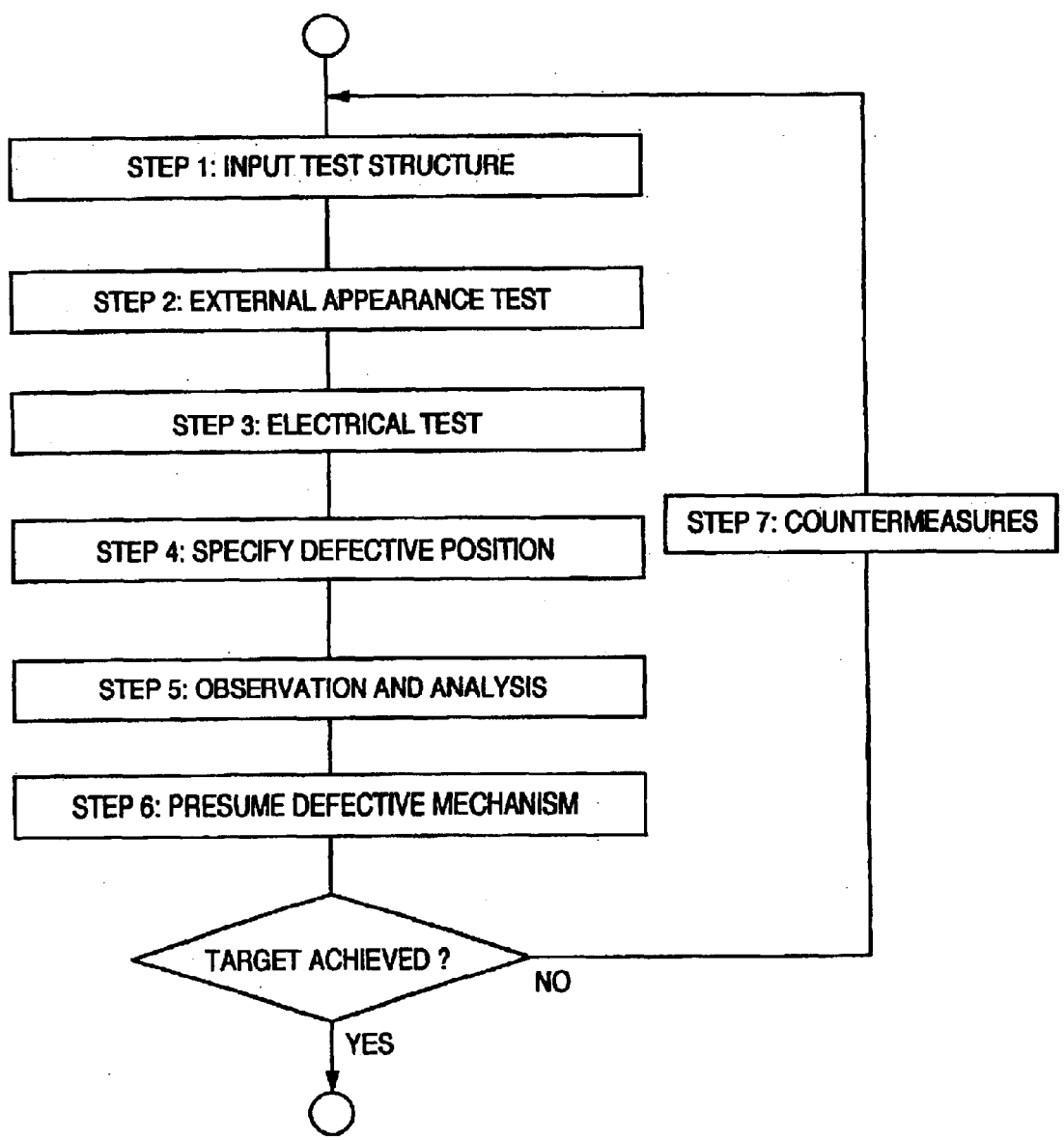
FIG. 19 is a flow chart showing a feedback method to a manufacturing line according to the present invention.

Referring now to FIG. 19, a feedback method to the manufacturing line according to the present invention is described. The manufacturing processes of the test structure are set up and Si wafer is inputted to the manufacturing line to perform manufacturing (STEP 1). The external appearance of the wafer is inspected (for example, particle check after formation of layers, visual inspection after etching and after CMP and SEM review after these inspections) during a desired process or after the process in the manufacturing processes (STEP 2). Then, electrical test using tester, probe and the like is performed to judge whether the test structure is good or bad (STEP 3). A test structure to be analyzed is selected on the basis of the result of the electrical test (while referring to the result of the visual inspection if necessary) to specify a defective position of the test structure (STEP 4). Observation of the surface and the section and analysis of material are performed by means of SEM or TEM on the basis of coordinates of the specified defective position (STEP 5) to presume a defective mechanism and consider countermeasures (STEP 6). After grasping whether the defect occurrence frequency is higher than a target or not if necessary and judging whether the countermeasures are performed or not, desired countermeasures (improvement of process and apparatus, cleaning of apparatus and the like) are performed and the result thereof is reflected to product of the subsequent lot number and confirm the effects thereof (STEP 7). Consequently, reduction of defect can be accelerated and improvement of yield can be realized.

As described above, even if a short circuit occurs between the open circuit detection lead wire 1 and the short-circuit detection lead wire 2 by electrically connecting the short-circuit detection lead wire 2 to the silicon substrate 6, whether the short circuit occurs or not can be detected by measuring a wiring resistance between the electrode connected to the open circuit detection lead wire 1 and the electrode connected to the silicon substrate 6.

Further, the n channel is formed in the P-type silicon substrate 6 to form the diode function, so that it can be configured not to discharge secondary electrons even by irradiation of charged particles in the voltage contrast method and even the short-circuited position can be detected as difference in contrast.

Consequently, the whole surface of the wafer having a plurality of test structures is electrically measured to thereby detect a defective test structure. Then, the defective test structure is subjected to detailed test to thereby make it possible to specify a defect occurrence position. Accordingly, the occurrence state of defect can be grasped efficiently and a defect occurrence model can be presumed in a short time, so that a countermeasure for an occurrence source of defect can be devised to thereby attain purification of the manufacturing line and improvement of yield in manufacturing.

Figure 21:
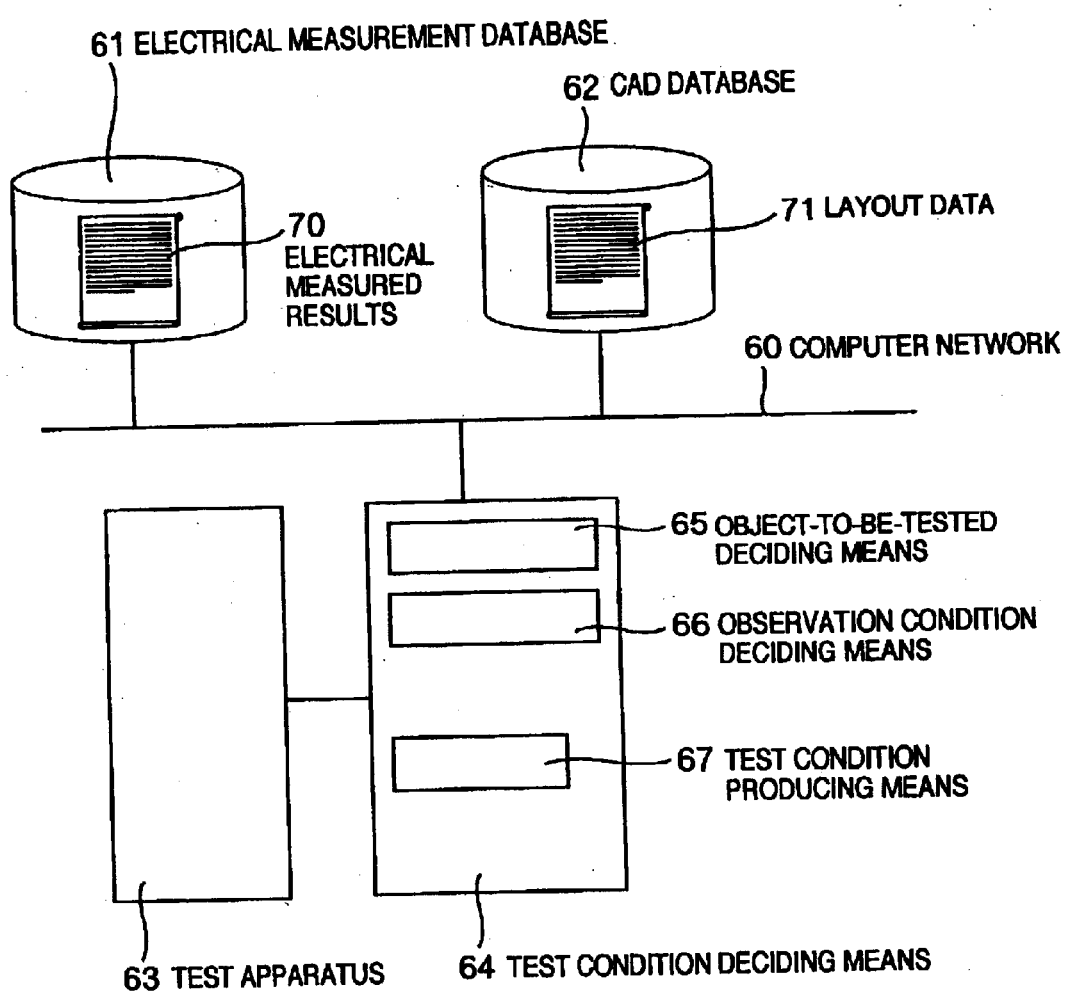
FIG. 21 schematically illustrates a test system according to the present invention.
Figure 22:
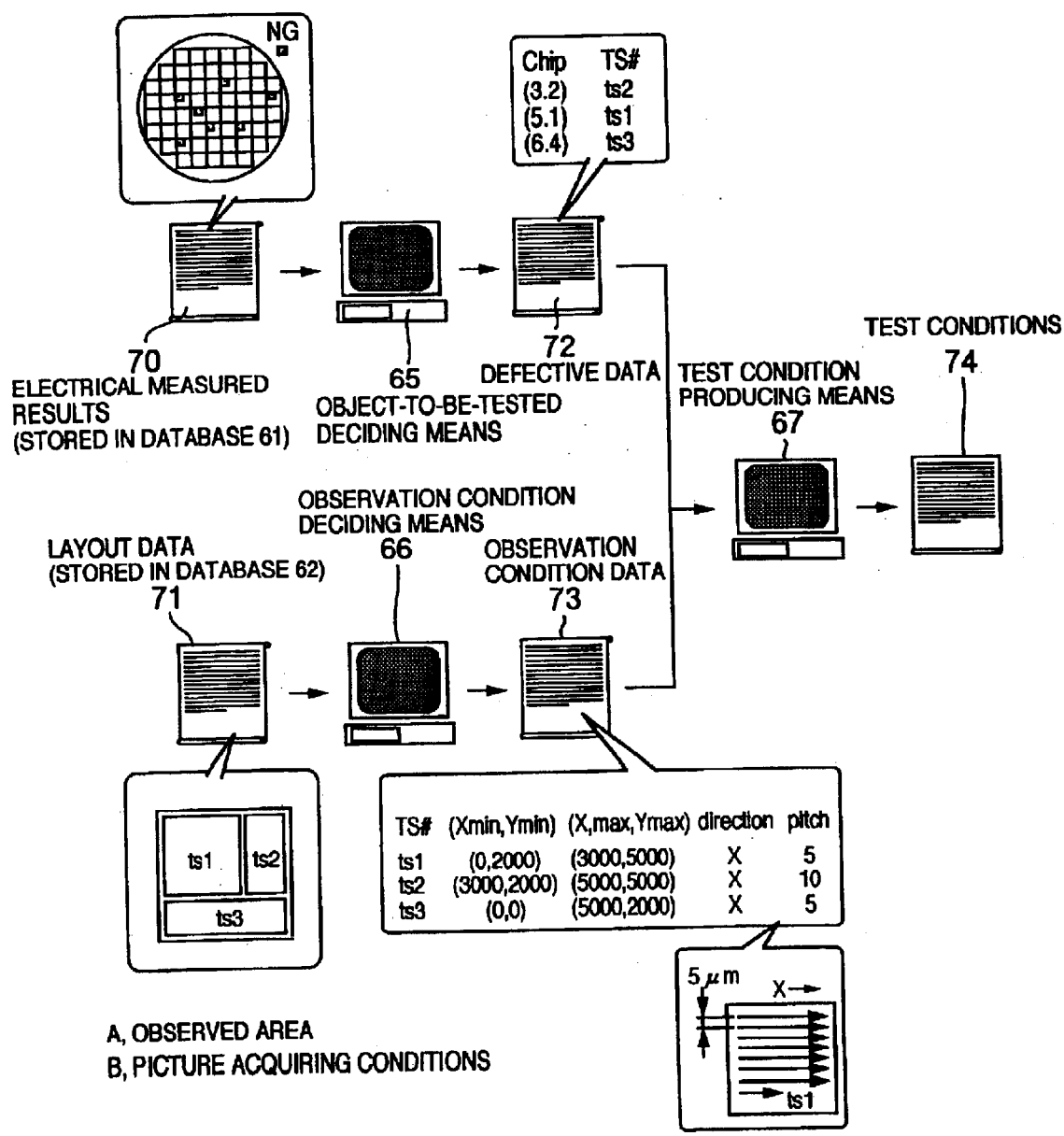
FIG. 22 shows a procedure of deciding test conditions.

A test system according to the present invention is now described. FIG. 21 schematically illustrates a test system according to the present invention. The test system includes an electrical measurement database 61 for storing electrical measured results 70 of test structure by the probe test, a CAD database 62 for storing design data of test structure, particularly layout data 71, test condition deciding means 64 for automatically or semi-automatically deciding test conditions for driving a test apparatus 63, and the test apparatus 63, which are connected through a computer network 60 to one another. The test condition deciding means 64 is composed of object-to-be-tested deciding means 65, observation condition deciding means 66 and test condition producing means 67. Referring now to FIG. 22, functions thereof are described.

FIG. 22 shows a procedure for deciding test conditions. The object-to-be-tested deciding means 65 is used so as to extract an object to be tested in accordance with arbitrary reference on the basis of the electrical measured results 70 describing electrical characteristics for each test structure including each chip provided in each wafer. That is, a lower limit of an electric resistance is set up for short circuit and an upper limit of an electric resistance is set up for open circuit. When the lower limit and the upper limit are exceeded, it is regarded as defective. The sifting operation is performed by the object-to-be-tested deciding means 65. For example, when only defective devices are tested, the object-to-be-tested deciding means 65 produces defective data 72 on the basis of a certain reference (for short-circuit defect, the test structure having a designated electric resistance value or less is judged as a defective test structure). The defective data 72 describes kinds of defective chips and test structures.

Figure 4C:
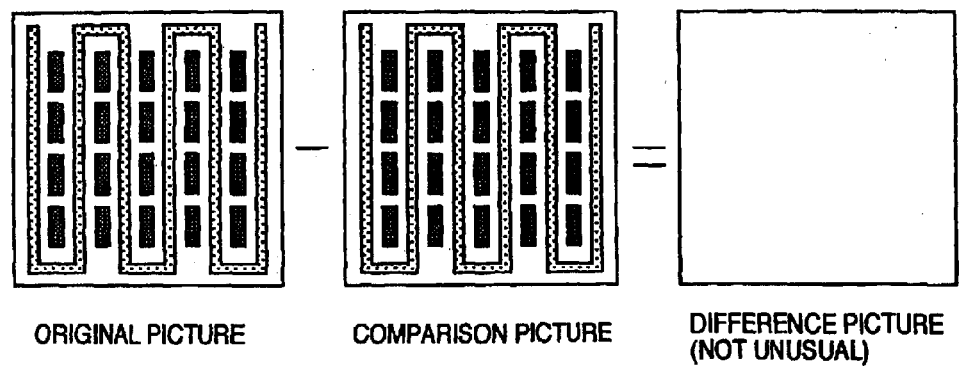

On the other hand, the observation condition deciding means is used to decide an observation area and the like. First of all, the layout data 71 of stream format is read in to be processed. One of the processes is processing for extracting coordinates of respective test structures. A desired test structure is selected by a cell name or the like and its area is outputted as lower left (Xmin, Ymin) and upper right (Xmax, Ymax) coordinates, for example. Further, when the test is performed using the voltage contrast by the charged beam, a scanning direction and a scanning pitch for thinning scanning are automatically calculated by analysis of the layout data as described with reference to FIG. 4. Concretely, the scanning pitch can be calculated by calculating a center position for each short-circuit detection lead wire 2 from the diagonal coordinates of the short-circuit detection lead wire 2 (rectangular area) and calculating a distance between two adjacent center points. In this manner, observation condition data 73 is outputted. The defective data 72 and the observation condition data 73 described above are both taken in the test condition producing means 67 to produce test conditions 74 automatically.

Figure 23:
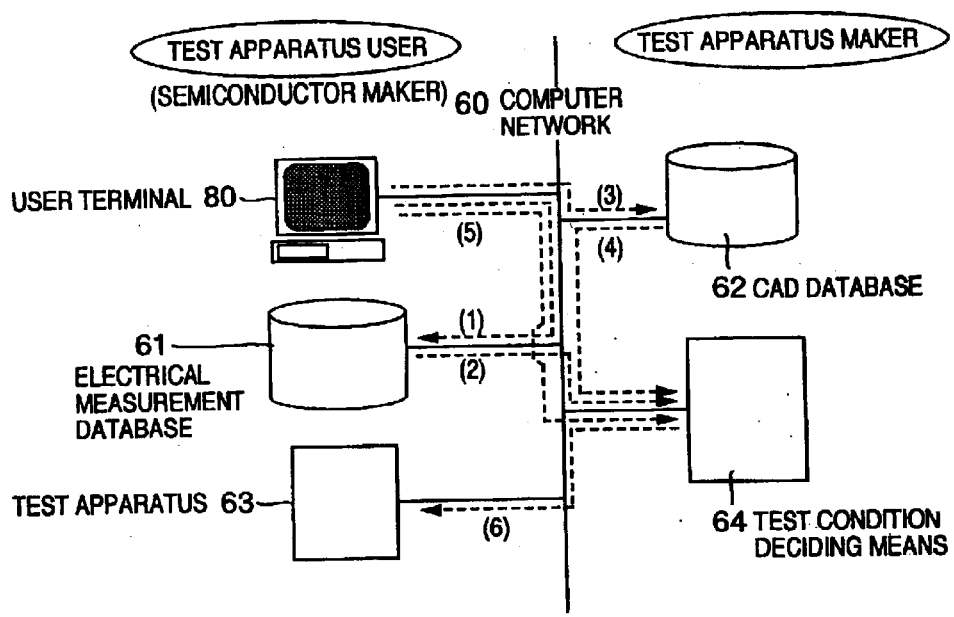
FIG. 23 illustrates a first working form of a test system according to the present invention.
Figure 24:
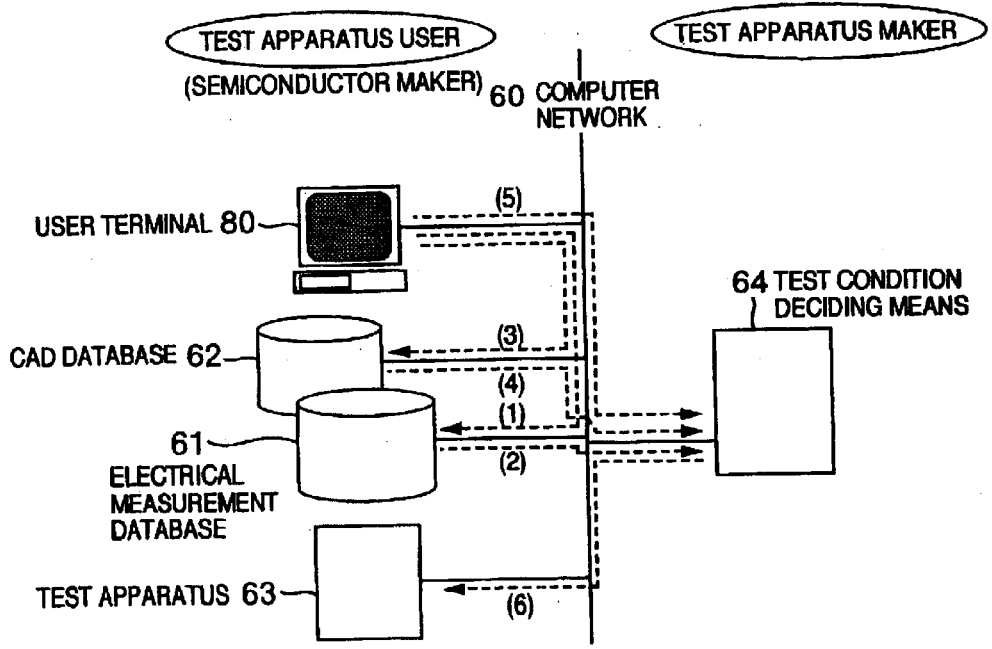
FIG. 24 illustrates a second wording form of a test system according to the present invention.

Next, two examples of working form of the test system are described. FIG. 23 is a diagram explaining a first working form of the test system according to the present invention. As a precondition, FIG. 23 shows the case where a semiconductor maker managing a semiconductor manufacturing line is supplied with design data of test structure from a test apparatus maker. A test apparatus user of the semiconductor maker uses a user terminal 80 to perform the test condition producing procedure as described below. First, desired electrical measured results 70 are retrieved from the electrical measurement database 61 (1) and data is transmitted to the test condition deciding means 64 owned by the test apparatus maker (2). Further, the user retrieves the layout data 71 stored in the CAD database 62 owned by the test apparatus maker (3) to transmit the data to the test condition deciding means 64 (4). Finally, the user inputs a command to produce test conditions (5) so that the data is transferred to the test apparatus (6). FIG. 24 is a diagram explaining a second working form of the test system according to the present invention. FIG. 24 shows the case where the layout data is stored in the CAD database managed by the test apparatus user and is utilized. Operation thereof is the same as that of FIG. 23 except for the CAD database managed by the test apparatus user and accordingly detailed description thereof is omitted.

Figure 25:
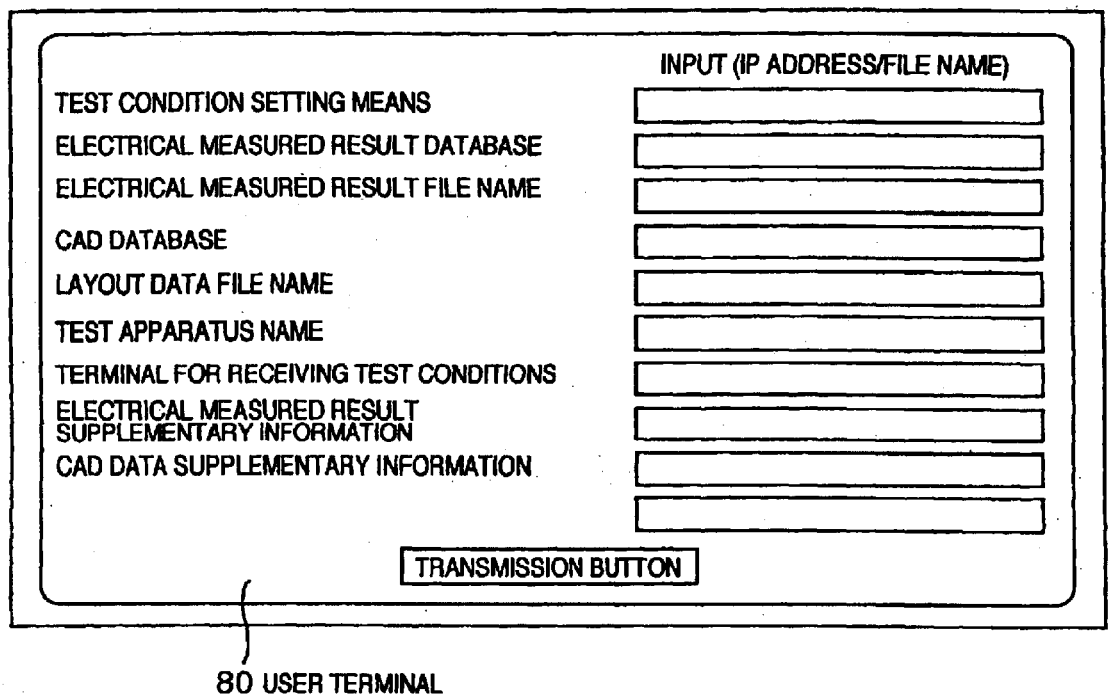
FIG. 25 illustrates a GUI picture for decision processing of test conditions.

Referring now to FIG. 25, a graphical user interface (GUI) displayed in the user terminal 80 is described. FIG. 25 is a diagram explaining a GUI picture for test condition deciding processing. Input items (IP address of test condition setting means, IP address of electrical measured result database, file name of electrical measured results and the like), IP addresses of computer and database, a location for storing file and a file name thereof described so far are designated to perform processing. A file-name describing electrical characteristic value (threshold value such as an electric resistance value) for discriminating good product and defective product is inputted into an input blank for supplementary information of the electrical measured result. A file name describing correspondence of kind of test structure to cell name on layout, a layer number table of layout and the like is inputted into an input blank for supplementary information of CAD data.

As described above, when the test condition deciding means 64 is provided in the test apparatus maker, a test condition preparation program included in the test condition deciding means 64 can be modified efficiently without going to user's facilities. Further, the test apparatus user can suppress excessive facility investment advantageously.

Figure 26:
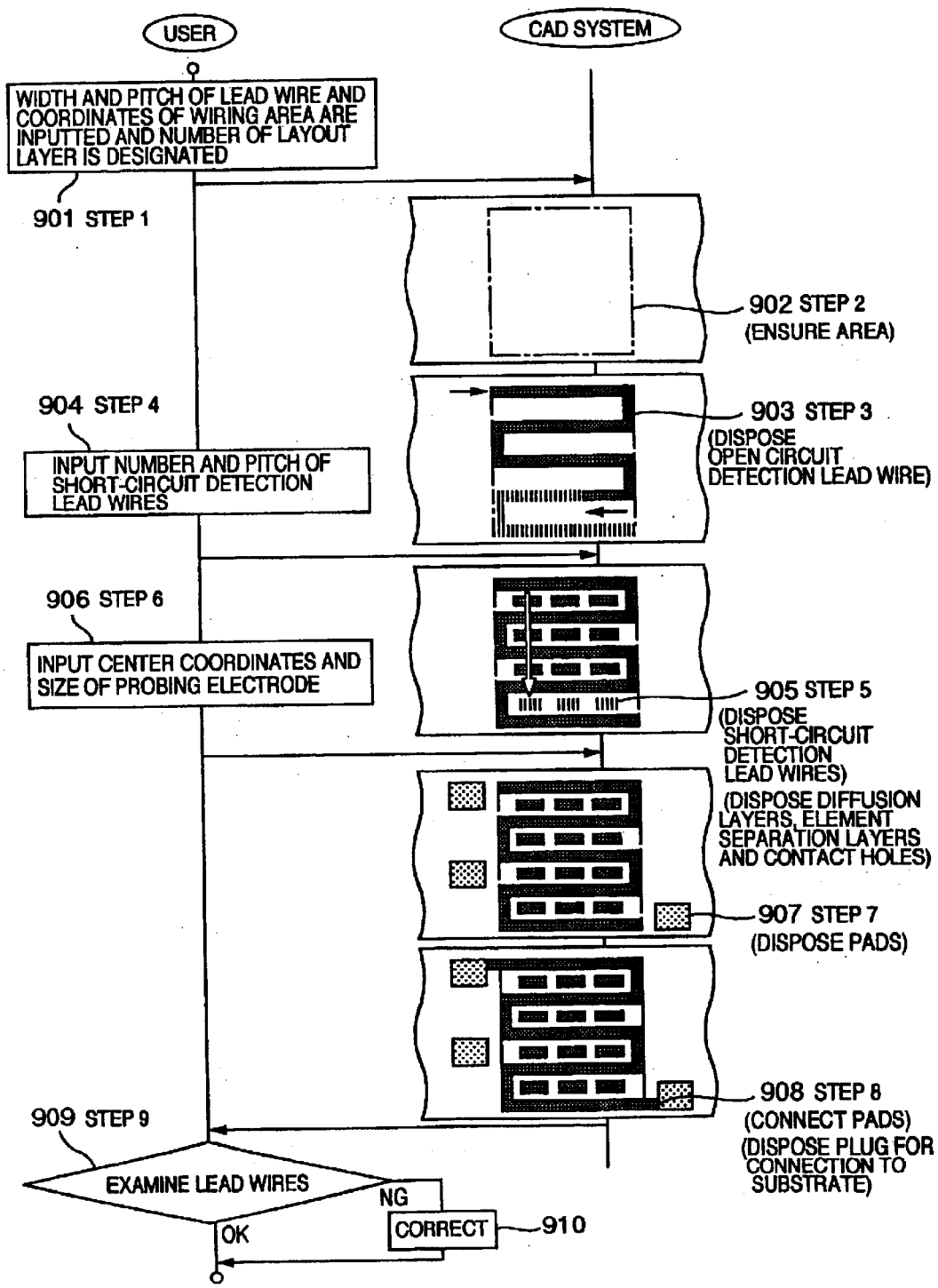
FIG. 26 illustrates a CAD system according to the present invention.

A CAD system for automatically producing layout data of the test structure is now described. FIG. 26 is a diagram explaining the CAD system according to the present invention. First, a width and a pitch of the open circuit detection lead wire and the short-circuit detection lead wire of the test structure and coordinates of a wiring area are inputted and the number of a layout layer is designated (step 1). The automatic layout processing of the CAD data is started. First, an area to be laid out is ensured on the layout from the coordinates of the wiring area (step 2). Next, the open circuit detection lead wire is disposed from one corner of the area so that the lead wire does not go out of the area. For example, the pitch of the open circuit detection lead wire is set up to be twice the wiring pitch of the short-circuit detection lead wire and the open circuit detection lead wire to thereby keep space so that the short-circuit detection can be disposed (step 3). Then, the user inputs data of the number of short-circuit detection lead wires to be disposed and the wiring pitch in the longitudinal direction of the lead wires (step 4). The short-circuit detection lead wires are disposed in the space between the open circuit detection lead wire little by little on the basis of the data (step 5). At the same time, diffusion layers constituted by the channel layer and the element separation layer are defined similarly to the short-circuit detection lead wire and the space therebetween is separated by the element separation layers. Further, the contact plugs for connecting the short-circuit detection lead wires and the diffusion layers are also laid out. Thereafter, the user inputs center coordinates and a size of the probing electrode (step 6). The CAD system disposes the probing electrode in accordance with the center coordinates (step 7). Next, electrodes on both ends of the open circuit detection lead wires and the substrate probing electrode are connected not to break into the wiring area (step 8). Further, a plug for connecting the probing electrode and the substrate is also disposed. Finally, the user examines the laid-out lead wires (step 9) and if necessary corrects the layout manually (step 10). Thus, the layout data 71 (layout data of the photo-mask for the test structure) is produced and the photo-mask can be manufactured on the basis of the layout data 71.

Figure 27:
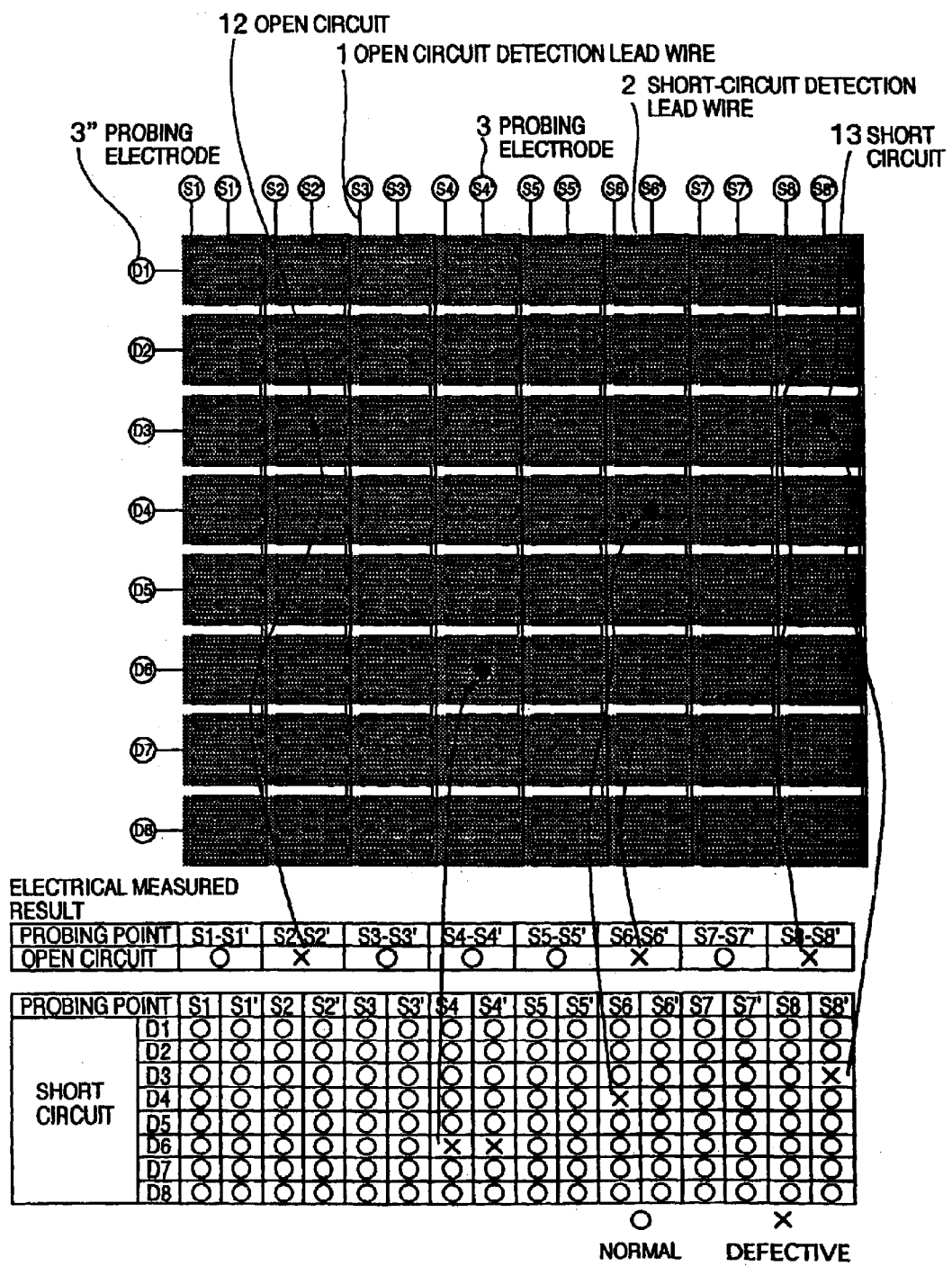
FIG. 27 illustrates an example of an application form of test structure.

When the test structure of the present invention is applied to the manufacturing line actually, it is necessary to increase the whole area of the test structure (the sum of the defect detection area and the area occupied by the probing pads) in order to increase a ratio of the defect detection area to the whole area of the test structure. FIG. 27 shows an example of an applied form of the test structure. With the increased area of the test structure, it is anticipated that a defective portion is difficult to specify since the length of an isolated lead wire in the longitudinal direction thereof is short and the width thereof is also narrow when the lead wire is short-circuited. In order to solve this problem, one test structure is divided into a plurality of sections to make it possible to roughly specify a defective portion by electrical measurement. In FIG. 27, the test structure is divided to form a matrix of 8 rows and 8 columns each having about 100 $\mu m \times 100\ \mu m$. 8 channels of open circuit detection lead wires 1 each extending in the vertical direction of FIG. 27 are disposed in the horizontal direction and 8 channels of P well layers each extending in the horizontal direction are disposed in the vertical direction. Two probing electrodes 3 and 3' ((S1, S1'), (S2, S2'), (S3, S3'), . . . ) are required for each channel of the open circuit detection and one probing electrode 3''' (D1, D2, D3, . . . ) is required for each channel of the short-circuit detection, so that 24 probing electrodes in total are disposed. The probing electrodes 3 and 3' connected to both ends of the respective open circuit detection lead wires 1 are used to detect open circuit for 8 channels. Detection of short circuit is made on the basis of electric resistance between the respective open circuit detection lead wires 1 and the respective P well layers. In other words, connection states for all combinations of 8 channels of meandering lead wires and 8 channels of P well layers are examined (the case where open circuit and short circuit occur simultaneously is considered and pads at both ends of the open circuit detection lead wires 3 and 3' are used). Thus, which section of 8 rows and 8 columns a short circuit occurs can be specified.

Further, FIG. 27 shows the relation of example of defects and electrical measured results at the time thereof (refer to a table shown below in FIG. 27). When a open circuit occurs (S2 area), its abnormality can be detected when S2 and S2' are probed. When a short circuit occurs ((S4, D6) area), its abnormality can be confirmed when S4 and D6, and S4' and D6 are probed and a small section where the short circuit occurs can be specified. When detailed observation is made thereafter, a position where the short circuit occurs may be specified on the basis of its result by means of the VC method or the like. When a open circuit and a short circuit occur simultaneously ((S6, D4) area), its abnormality can be detected when S6 and D4 are probed.

According to the present invention, the test efficiency using the test structure can be improved and consequently yield can be improved.

It should be further understood by those skilled in the art that the foregoing description has been made on embodiments of the invention and that various changes and modifications may be made in the invention without departing from the spirit of the invention and the scope of the appended claims.

What is claimed is:

1. A photo-mask for manufacturing a wafer for testing manufacturing processes of an electronic device, comprising:

a first mask pattern for forming a first testing lead wire disposed on an insulating layer formed in a silicon substrate; and a second mask pattern for forming a second testing lead wire electrically connected to said silicon substrate and disposed on said insulating layer.

2. A photo-mask according to claim 1, wherein said first mask pattern is a mask pattern for forming a circuit for testing whether said first testing lead wire is disconnected or not and said second mask pattern is a mask pattern for forming a circuit for testing whether said first and second testing lead wires are short-circuited or not.

3. A photo-mask according to claim 1, wherein said first mask pattern is formed into teeth of a comb or zigzag.

4. A photo-mask according to claim 2, wherein said first mask pattern is formed into teeth of a comb or zigzag.

5. A photo-mask according to claim 1, wherein said second mask pattern includes a plurality of patterns disposed along said first mask pattern at a predetermined pitch.

6. A photo-mask according to claim 2, wherein said second mask pattern includes a plurality of patterns disposed along said first mask pattern at a predetermined pitch.

7. A photo-mask for manufacturing a wafer for testing manufacturing processes of an electronic device, comprising:

a first mask pattern for forming a first testing lead wire disposed on an insulating layer formed in a silicon substrate: and a second mask pattern for forming a second testing lead wire electrically connected through an n-channel formed in said silicon substrate and disposed on said insulating layer.

8. A photo-mask according to claim 7, wherein said first mask pattern is a mask pattern for forming a circuit for testing whether said first testing lead wire is disconnected or not and said second mask pattern is a mask pattern for forming a circuit for testing whether said first and second testing lead wires are short-circuited or not.

9. A photo-mask according to claim 7, wherein said first mask pattern is formed into teeth of a comb or zigzag.

10. A photo-mask according to claim 8, wherein said first mask pattern is fanned into teeth of a comb or zigzag.

11. A photo-mask according to claim 7, wherein said second mask pattern includes a plurality of patterns disposed along said first mask pattern at a predetermined pitch.

12. A photo-mask according to claim 8, wherein said second mask pattern includes a plurality of patterns disposed along said first mask pattern at a predetermined pitch.

13. Wiring layout data for forming a photo-mask according to claim 1.

14. Wiring layout data for forming a photo-mask according to claim 2.

15. Wiring layout data for forming a photo-mask according to claim 7.

16. Wiring layout data for forming a photo-mask according to claim 8.

* * * * *